United States Patent
Yamagami et al.

(10) Patent No.: US 9,947,553 B2
(45) Date of Patent: Apr. 17, 2018

(54) MANUFACTURING METHOD OF SEMICONDUCTOR DEVICE AND SEMICONDUCTOR DEVICE

(71) Applicant: ROHM CO., LTD., Kyoto (JP)

(72) Inventors: Mamoru Yamagami, Kyoto (JP); Yasuhiro Fuwa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/993,857

(22) Filed: Jan. 12, 2016

(65) Prior Publication Data

US 2016/0211198 A1    Jul. 21, 2016

(30) Foreign Application Priority Data

Jan. 16, 2015  (JP) ................... 2015-006796
Oct. 15, 2015  (JP) ................... 2015-203957

(51) Int. Cl.
*H01L 21/48*  (2006.01)
*H01L 21/56*  (2006.01)
(Continued)

(52) U.S. Cl.
CPC ........ *H01L 21/568* (2013.01); *H01L 21/4825* (2013.01); *H01L 21/561* (2013.01);
(Continued)

(58) Field of Classification Search
CPC . H01L 21/4825; H01L 21/563; H01L 21/565; H01L 21/78; H01L 23/4951; H01L 23/49524; H01L 23/544; H01L 24/96; H01L 21/568; H01L 21/561; H01L 23/49541; H01L 23/49582; H01L 23/548; H01L 2021/6006
(Continued)

(56) References Cited

U.S. PATENT DOCUMENTS

2003/0107129 A1 *  6/2003  Ono ................. H01L 21/4857
                                                    257/734
2004/0124547 A1 *  7/2004  Jobetto .............. H01L 21/561
                                                    257/791

(Continued)

FOREIGN PATENT DOCUMENTS

JP     2014-056924 A     3/2014
WO  WO-2012-137714 A1 * 10/2012 .......... H01L 21/568

*Primary Examiner* — Johannes P Mondt
(74) *Attorney, Agent, or Firm* — Rabin & Berdo, P.C.

(57) ABSTRACT

The present invention provides a semiconductor device and a method for manufacturing a semiconductor device. The method comprises: Preparing a semiconductor chip 6 with a first electrode layer 21 formed on an element-forming surface 7. Prepared a support member 30 having a conductor 31 formed on a pattern-forming surface 33. The first electrode layer 21 is bonded to the conductor 31 by a solder, and thus the semiconductor chip 6 is fixed on the support member 30. While the semiconductor chip 6 is fixed on the support member 30, the semiconductor chip 6 is coated by the sealing resin 3 to form a sealing structure 46. By removing the support member 30 from the sealing structure 46, the conductor 31 formed on the support member 30 is transferred to the sealing structure 46. The conductor 31 transferred to the sealing structure 46 is an external electrode exposed from the sealing structure 46.

12 Claims, 26 Drawing Sheets

(51) Int. Cl.
*H01L 21/78* (2006.01)
*H01L 23/495* (2006.01)
*H01L 23/00* (2006.01)
*H01L 23/544* (2006.01)

(52) U.S. Cl.
CPC .......... *H01L 21/78* (2013.01); *H01L 23/4951* (2013.01); *H01L 23/49524* (2013.01); *H01L 23/544* (2013.01); *H01L 24/96* (2013.01); H01L 23/49541 (2013.01); H01L 23/49548 (2013.01); H01L 23/49582 (2013.01); H01L 2223/54426 (2013.01); H01L 2223/54486 (2013.01); H01L 2224/18 (2013.01); H01L 2924/0002 (2013.01); H01L 2924/181 (2013.01)

(58) Field of Classification Search
USPC .................... 438/118, 123, 124, 126, 127
See application file for complete search history.

(56) References Cited

U.S. PATENT DOCUMENTS

2013/0264710 A1* 10/2013 Osugi ................. H01L 27/0814
                                                                257/741
2014/0004658 A1*  1/2014 Priewasser .............. H01L 21/56
                                                                438/118
2014/0021627 A1*  1/2014 Kimura ............. H01L 23/49541
                                                                257/773

* cited by examiner

MANUFACTURING METHOD OF SEMICONDUCTOR DEVICE AND SEMICONDUCTOR DEVICE

BACKGROUND

The present invention relates to a semiconductor device and a method for manufacturing the semiconductor device.

Patent literature 1 discloses a method for manufacturing a semiconductor device, which includes the following steps of: adhering a back side of a semiconductor element having an electrode protrusion formed on a front side thereof to a temporary fixing layer on a support member; sealing the front side of the semiconductor element through a resin composition; removing the support member and the temporary fixing layer to expose the back side of the semiconductor element; and grinding the resin composition on the front side of the semiconductor element to expose a portion of the electrode protrusion.

LITERATURE OF PRIOR ART

Patent Literature

[Patent literature 1] Japanese patent laid-open publication No. 2014-56924.

BRIEF SUMMARY OF THE INVENTION

Problems to be Solved in the Present Invention

An object of the present invention is to provide a semiconductor device and a method for manufacturing a semiconductor device capable of simplifying the manufacturing process.

Another object of the present invention is to provide a semiconductor device and a method for manufacturing a semiconductor device capable of cost reduction and miniaturization.

Technical Means for Solving Problems

In order to achieve the objects of the present invention, the method for manufacturing a semiconductor device includes the following steps: preparing a semiconductor chip with an electrode layer formed on a front side of the semiconductor chip; preparing a support member with a conductor formed on a front side of the support member; fixing the semiconductor chip to the support member by bonding the electrode layer of the semiconductor chip to the conductor of the support member through a solder; forming a sealing structure, in which the semiconductor chip is sealed with a resin by coating the semiconductor chip through the resin while the semiconductor chip is fixed on the support member; and transferring the conductor of the support member to the sealing structure by removing the support member from the sealing structure.

According to this method, while the front side of the semiconductor chip faces the front side of the supporting member, the electrode layer formed on the semiconductor chip is bonded to the conductor formed on the support member through the solder. In other words, the semiconductor chip is flip-chip bonded to the support member. The conductor formed on the support member is electrically connected to the semiconductor chip via the solder and the electrode layer formed on the semiconductor chip. During this method, the semiconductor chip is coated through the resin, and thus the semiconductor chip is sealed through the resin to form a sealing structure. Then, the conductor is transferred to the sealing structure by removing the support member. The conductor transferred to the sealing structure is exposed from the sealing structure. The conductor exposed from the sealing structure can be used as a connecting electrode capable of electrically connected to the outside of the sealing structure.

According to this method, after the semiconductor chip is coated through the resin to form a sealing structure, the support member is removed, thus a conductor exposed from the sealing structure can be formed, such that a step of grinding the resin can be omitted. Accordingly, the manufacturing process can be simplified. Further, according to this method, in the sealing structure, there is no need to place the semiconductor chip on a lead frame and connect the semiconductor chips to a lead terminal via bounding wires. Accordingly, the number of components can be reduced, and thus the manufacturing cost of the semiconductor device can be reduced. Further, the resin coating the semiconductor chip also serves as the package, such that the minimization of the semiconductor device also can be achieved.

Preferably, the step of fixing the semiconductor chip includes a step of fixing a plurality of the semiconductor chips to the support member, and the step of forming the sealing structure includes a step of coating the plurality of semiconductor chips collectively through the resin.

In this method, preferably, after the step of transferring, further includes a step of singulating the sealing structure into a plurality of sealing structure bodies by cutting the sealing structure along a cutting line between the plurality of semiconductor chips, wherein the plurality of sealing structure bodies comprise the semiconductor chips sealed through the resin.

According to this method, the step of forming the sealing structure can be performed in common to a plurality of semiconductor chips, and thus the manufacturing efficiency can be improved. Accordingly, the manufacturing cost of the semiconductor device can be further reduced.

The step of transferring can also include a step of forming the conductor as an external terminal in an area surrounded by lateral sides of the semiconductor chips in a top view from the normal direction of the front side of the semiconductor chip.

According to this method, a Fan-in semiconductor device, having an external terminal formed in an area surrounded by lateral sides of a semiconductor chip in the top view, can be manufactured. Further, the step of transferring the conductor to the sealing structure can be also used as a step of forming the external terminal thereby the increment of the manufacturing process can be avoided.

After the step of transferring, the method can further include a step of forming a rewiring bonded to the conductor and the rewiring being routed on the sealing structure.

Accordance with this method, the connecting electrode for electrically connecting the conductor to the outside can be disposed on various portions of the sealing structure through the rewiring. Hence, the flexibly in design to the arrangement of the connecting electrode can be improved.

Preferably, the step of forming the rewiring includes a step of forming the rewiring to cross the lateral side of the semiconductor chip and the rewiring being drawn out to an area outside the semiconductor chip in a top view from the normal direction of the front side of the semiconductor chip. It is preferred that after the step of forming the rewiring, the method further includes a step of forming an external terminal which is electrically connected to the rewiring and having at least a portion located in an area outside the semiconductor chip in the top view.

According to this method, the resin is formed to coat the lateral side of the semiconductor chip and thus, in the top view, an area above the resin outside the semiconductor chip can be used as an area for forming a rewiring. Therefore, the area for an external terminal electrically connected to the rewiring to be formed therein is not limited to an area directly above the front side of the semiconductor chip. Accordingly, a Fan-out semiconductor device, having an external terminal formed in an area outside the semiconductor chip, can be manufactured. Hence, a minimized semiconductor device with multiple external terminals can be manufactured.

The step of preparing the support member can also include a step of forming the conductor on the support member, wherein the conductor includes a connecting portion for bonding to the electrode layer of the semiconductor chip through the solder; and a wiring portion for bonding to the connecting portion and being routed from the connecting portion. In this method, the step of transferring the conductor is a step of transferring the wiring portion of the conductor to the sealing structure as a rewiring.

According to this method, another method for manufacturing a semiconductor device with a rewiring can be provided. In other words, a conductor is pre-formed on the support member, wherein the conductor includes a connecting portion connected to the electrode layer of the semiconductor chip through the solder, and a wiring portion to be a source of a rewiring. In the step of transferring, the connecting portion and the wiring portion are integrally transferred to the sealing structure. The transferred wiring portion is formed as the rewiring exposed from the sealing structure. According to this method, the rewiring can also be formed on the sealing structure, and thus the connecting electrode for electrically connecting the conductor to the outside can be disposed on various portions of the sealing structure through the rewiring.

Preferably, in the step of transferring the rewiring, in a top view from the normal direction of the front side of the semiconductor chip, the wiring portion is transferred to cross the lateral side of the semiconductor chip and the rewiring being drawn out to an area outside the semiconductor chip. In this method, preferably, after the step of transferring the rewiring, the method further includes a step of forming an external terminal electrically connected to the rewiring, wherein the external terminal has at least a portion located in an area outside the semiconductor chip in the top view.

According to this method, in the top view, the rewiring is formed to cross the lateral sides of the semiconductor chip, such that the area outside the semiconductor chip can be used as an area for forming an external terminal. Therefore, the area for forming the external terminal electrically connected to the rewiring is not limited to the area directly above the front side of the semiconductor chip. Accordingly, a Fan-out semiconductor device, having an external terminal formed in an area outside the semiconductor chip, can be manufactured. Hence, a minimized semiconductor device with multiple external terminals can be manufactured.

The support member can also be a plate member for forming the conductor, and can be peeled from the sealing structure. In this method, the step of removing the support member from the sealing structure can be a step of peeling the plate member from the sealing structure. According to this method, the conductor can be easily transferred to the sealing structure by peeling the plate member from the sealing structure.

The plate member is preferably a metal plate including stainless steel or copper. If the plate member is a metal plate including stainless steel or copper, the metal plate can be well peeled from the sealing structure. Accordingly, the conductor can be well transferred to the sealing structure without complicating the manufacturing process.

The support member can also be a plate member for forming the conductor, and can be etched. In this method, the step of removing the support member from the sealing structure is preferably a step of removing the plate member by etching. According to this method, the conductor can be easily transferred to the sealing structure by removing the plate structure through etching.

Preferably, the plate member is a semiconductor plate. If the plate member is a semiconductor plate, the semiconductor plate can be well removed by etching. Accordingly, the conductor can be well transferred to the sealing structure without complicating the manufacturing process.

The semiconductor device of the present invention includes: a semiconductor chip; an electrode formed on a front side of the semiconductor chip; and a resin configured to coat each of the front side, a back side and a lateral side of the semiconductor chip to expose a portion of the electrode. The electrode has a laminated structure, wherein the laminated structure includes a first electrode layer, a second electrode layer formed over the first electrode layer, and a solder disposed between the first electrode layer and the second electrode layer.

The semiconductor device of this configuration, for example, can be manufactured by the manufacturing method of a semiconductor device described above. According to the configuration, there is no need to place the semiconductor chips on a lead frame and connect the semiconductor chips to a lead terminal via bounding wires, such that the number of components can be reduced. Accordingly, the relatively low-cost semiconductor device can be provided. Further, the resin coating the semiconductor chip also serves as the package, such that the minimization of the semiconductor device is achieved.

In a top view from the normal direction of the front side of the semiconductor chip, the electrode is an external terminal located in an area surrounded by the lateral side of the semiconductor chip. According to the configuration, a Fan-in semiconductor device, having an external terminal formed in an area surrounded by lateral sides of a semiconductor chip, can be provided. The semiconductor device can further include a rewiring electrically connected to the electrode and formed on the resin. Instead, the semiconductor device can further include a rewiring electrically connected to the electrode and coated through the resin.

According to the configurations, the electronical connection between the conductor and the outside can be performed on various portions of the sealing structure through the rewiring.

In a top view from the normal direction of the front side of the semiconductor chip, the rewiring is formed to cross the lateral side of the semiconductor chip to reach an area outside the semiconductor chip. In this method, preferably, the semiconductor device further includes an external terminal, which is electrically connected to the rewiring, and having at least a portion located in an area outside the semiconductor chip in the top view.

According to the configuration, since the resin coating the lateral side of the semiconductor chip is formed, in the top view, the area on the resin outside the semiconductor chip can be used as an area for forming the rewiring. Therefore, the area for forming the external terminal electrically connected to the rewiring is not limited to the area directly above the front side of the semiconductor chip. Accordingly, a Fan-out semiconductor device, having an external terminal formed in an area outside the semiconductor chip, can be manufactured. Hence, a minimized semiconductor device with multiple external terminals is provided.

The rewiring can also include a copper wiring. The first electrode layer can also include a copper film, a gold film or a nickel film. The second electrode layer can also include a copper film, a gold film or a nickel film.

DETAILED DESCRIPTION

Referring to the accompanying drawings, the embodiments of the present invention are illustrated detailed in the following descriptions.

<First Embodiment>

Figure 1:
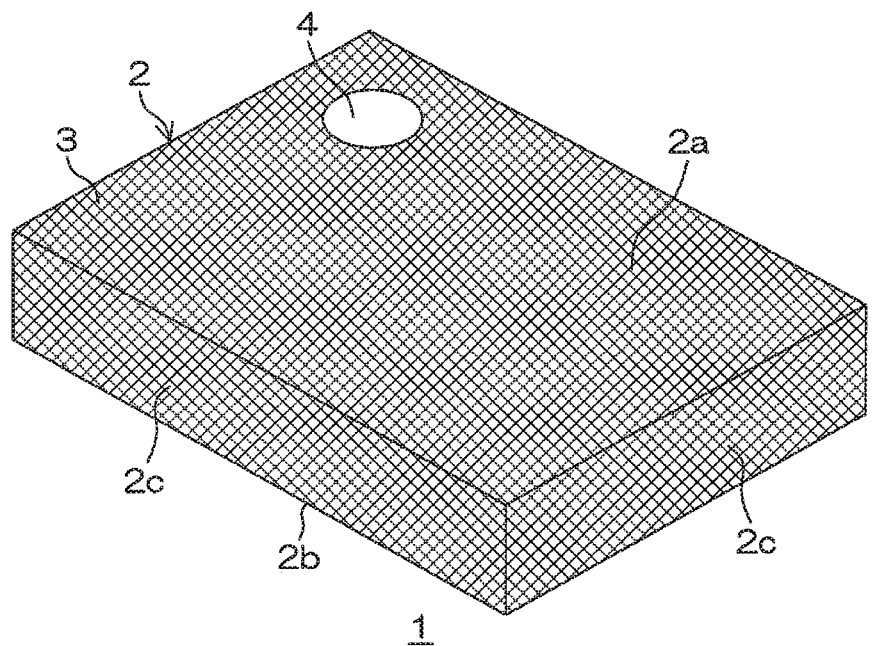
FIG. 1 is a perspective view showing a semiconductor device in accordance with the first embodiment of the present invention.
Figure 2:
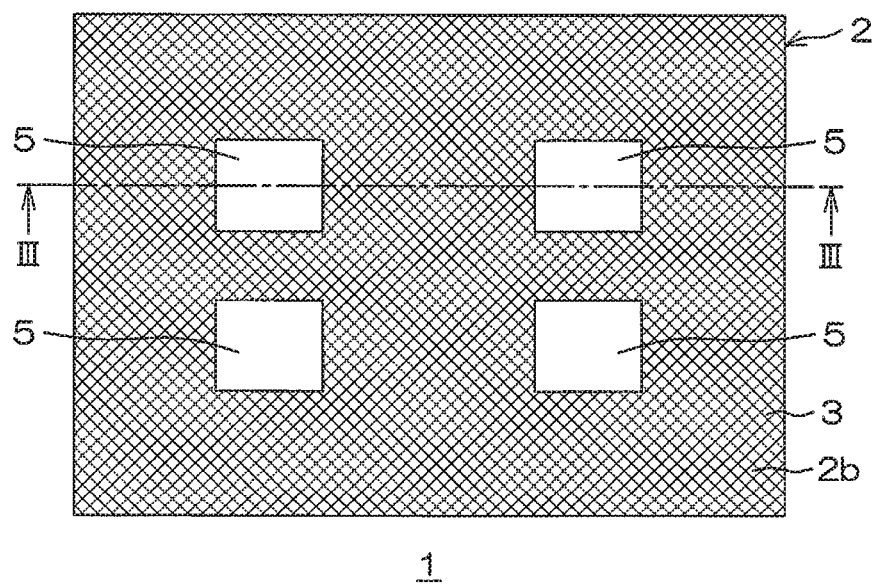
FIG. 2 is a bottom view of the semiconductor device shown in FIG. 1.

FIG. 1 is a perspective view showing a semiconductor device 1 according to the first embodiment of the present invention. FIG. 2 is a bottom view of the semiconductor device 1 shown in FIG. 1. In FIGS. 1 and 2, a package body 2 is indicated by the cross-hatching for clarity.

The semiconductor device 1 includes a package body 2. For example, the package body 2 is formed in a substantially rectangular shape, and includes a front side 2a, a back side 2b and four lateral sides 2c. The four lateral sides 2c are respectively connected to the front side 2a and the back side 2b. The package body 2 includes a seal resin 3, such as epoxy resin.

A label 4 indicating the mounting direction is formed on the corner portion of the front side 2a of the package body 2. In this embodiment, a mark is formed as the label 4 on the package body 2. Alternatively, the label 4 may be a recess portion recessing toward the back side 2b of the package body 2.

On the back side 2b of the package body 2, a plurality of external terminals 5 (four external terminals in this embodiment) are formed to be exposed from the package body 2. The external terminals 5 are disposed at intervals from each other, and respectively formed in a substantially rectangular shape. Each external terminal 5 is disposed from the lateral side 2c toward the inner side of the package body 2 at intervals. For example, each external terminal 5 is connected to wirings disposed on a mounting substrate through solder.

Figure 3:
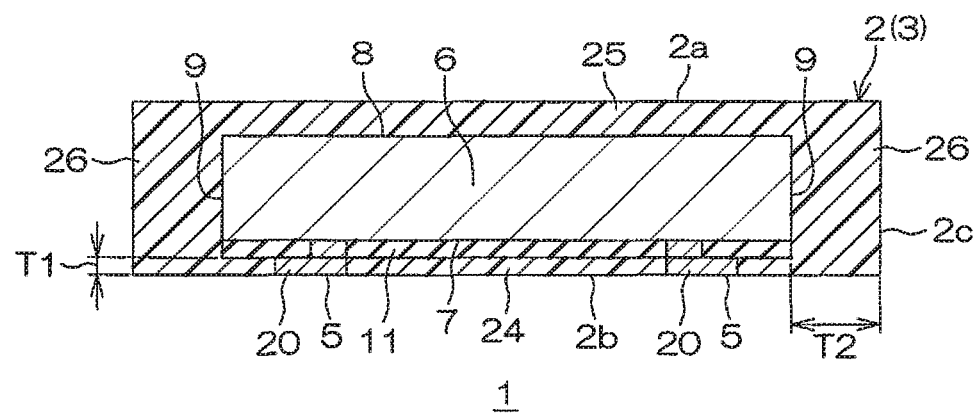
FIG. 3 is a cross-sectional view along the line III-III shown in FIG. 2.
Figure 4:
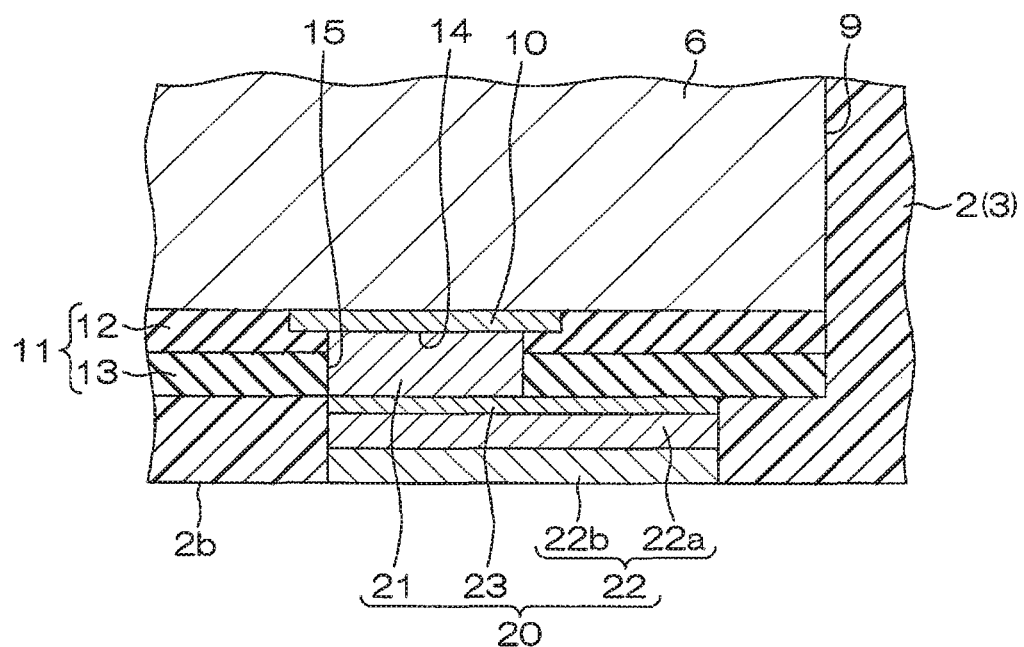
FIG. 4 is a partially enlarged cross-sectional view of the structure shown in FIG. 3.

FIG. 3 is a cross-sectional view along the line III-III shown in FIG. 2. FIG. 4 is a partially enlarged cross-sectional view of the structure shown in FIG. 3.

The semiconductor device 1 includes a semiconductor chip 6. The semiconductor 6 is formed in, for example, a substantially rectangular shape, and has two main sides 7, 8 and four lateral sides 9. The four lateral sides 9 are respectively connected to two main sides 7, 8. In the following description, the main side 7 with a semiconductor element formed thereon is called "an element-forming surface 7", and the main side 8 opposing the main side 7 is called "a back side 8".

For example, the semiconductor element may be various semiconductor elements made of semiconductors. The semiconductor elements, for example, can also comprise a transistor or a diode. The semiconductor element can also be used for forming a portion of an integrated circuit such as small scale integration (SSI), large scale integration (LSI), medium scale integration (MSI), very large scale integration (VLSI), or ultra-very large scale integration (ULSI). Further, the semiconductor element can also be a portion of a voltage control element, such as low drop out (LDO), or a portion of an amplifying element, such as an operational amplifier.

As shown in FIG. 4, a wiring film 10 electrically connected to the semiconductor element is formed on the element-forming surface 7 of the semiconductor chip 6. The wiring film 10, for example, can be an aluminum film. In this embodiment, the wiring film 10 is formed as the lowermost wiring in contact with the element-forming surface 7. For example, when the semiconductor device 1 has a multi-layered wiring structure, the wiring film 10 can also be formed as the topmost wiring exposed from the top surface of the multi-layered wiring structure. In this case, the multi-layered wiring structure can also have a plurality of insulation layers formed over the element-forming surface 7, a plurality of wiring layers, and a via electrode for electrically connecting the upper wiring layer and the lower wiring layer which have the insulation layers interposed therebetween.

An insulation film 11 is formed to cover the whole area of the element-forming surface 7 of the semiconductor chip 6. As shown in FIG. 4, the insulation film 11 includes a laminated structure comprising a passivation film 12 and a resin film 13. The passivation film 12, for example, can be a nitride film. The resin film 12, for example, can be a polyimide film. A pad opening 15 for exposing a portion of the wiring film 10 as an electrode pad 14 is formed in the insulation film 11. An electrode 20 is formed on the insulation film 11 to be electrically connected to the wiring film 10 and to form the external terminal 5.

More specifically, according to the top view from the normal direction of the element-forming surface 7 of the semiconductor chip 6 (hereafter, referred as "top view"), the electrode 20 is formed in the area surrounded by the lateral sides 9 of the semiconductor chip 6. As shown in FIG. 4, the electrode 20 has a laminated structure which includes a first electrode layer 21, a second electrode layer 22 formed over the first electrode layer 21, and a solder 23 disposed between the first electrode layer 21 and the second electrode layer 22.

The first electrode layer 21 is buried in the pad opening 15. The first electrode layer 21 includes a copper film, a gold film or a nickel film. The first electrode layer 21 can also be a laminated film which includes a gold film formed on the wiring film 10, and a nickel film formed on the gold film. In this embodiment, the first electrode layer 21 including the nickel film is formed.

The second electrode layer 22 is formed over the first electrode layer 21 with the solder 23 interposed therebetween. The second electrode layer 22 is electrically connected to the first electrode layer 21 via the solder 23. The top surface of the second electrode layer 22 is formed as an external terminal (also referring to FIG. 2). The second electrode layer 22 includes a copper film, a gold film, or a nickel film. In this embodiment, the second electrode layer 22 including a laminated film is formed, and the laminated film includes a nickel film 22a formed on the solder 23, and a gold film 22b formed on the nickel film 22a.

The solder 23 is formed to cover at least a front side of the first electrode layer 21 exposed from the insulation film 11. The solder 23 can also be an alloy including at least two selected from the group consisting of Sn, Pb, P, Ag, Cu, Ni, Ge, Bi, In, Zn, Al, Sb and Co. For example, the solder 23 can be an alloy including Sn and Pb, an alloy including Sn and P, or an alloy including Sn and Sb.

The seal resin 3 is formed to coat the semiconductor chip 6. The seal resin 3 is formed to coat the whole area of each of the element-forming surface 7, the back side 8 and the lateral sides 9 of the semiconductor chip 6. More specifically, the seal resin 3 integrally has a back portion 24 for coating the element-forming surface 7 (insulation film 11) of the semiconductor chip 6, a front portion 25 for coating the back side 8 of the semiconductor chip 6, and a periphery portion 26 for coating the lateral sides 9 of the semiconductor chip 6.

The front side 2a of the package body 2 is formed by the front portion 25 and the periphery portion 26 of the seal resin 3. The back side 2b of the package body 2 is formed by the back portion 24 and the periphery portion 26 of the seal resin 3. The lateral side 2c of the package body 2 is formed by the periphery portion 26 of the seal resin 3. As shown in FIG. 3, the thickness T1 of the back portion 24 of the seal resin 3 with respect to the normal direction of the element-forming surface 7 of the semiconductor chip 6, is less than the thickness T2 of the periphery portion 26 of the seal resin 3 with respect to the normal direction of the lateral side 9 of the semiconductor chip 6. The back portion 24 of the seal resin 3 is coated on the whole area of the insulation film 11 to expose the top surface of the second electrode layer 22.

The back portion 24 of the seal resin 3 is coplanar with the top surface of the second electrode layer 22. Accordingly, the portion of the second electrode layer 22 which is exposed from the back portion 24 of the seal resin 3 is formed as an external terminal 5. Thus, the package body 2 with the semiconductor chip 6 sealed through the seal resin 3 is formed (referring to FIGS. 1 and 2).

Figure 34:
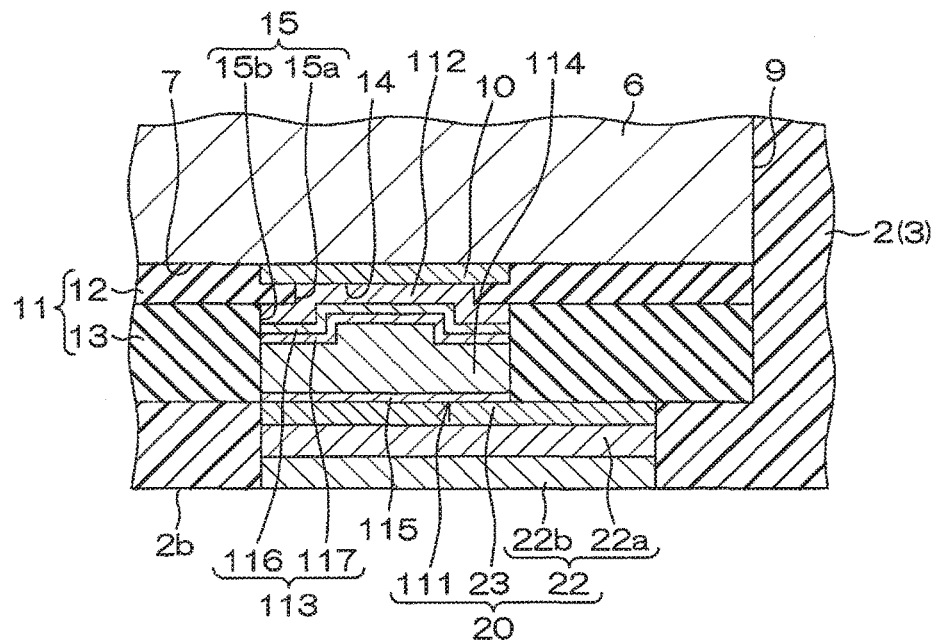
FIG. 34 is an enlarged cross-sectional view of a variation of the electrode shown in FIG. 4.

The configuration of the electrode 20 shown in FIG. 4 can also be changed to the configuration shown in FIG. 34. FIG. 34 is an enlarged cross-sectional view of the variation of the electrode 20 shown in FIG. 4.

Referring to FIG. 34, the variation of the electrode 20 is characterized by including a first electrode layer 111 instead of the first electrode layer 21. Specifically, the first electrode layer 111 includes a stress relaxation layer 112, an under bump metal (UBM) layer 113, a pillar layer 114 and a barrier layer 115 laminated sequentially from the semiconductor chip 6.

In this case, the pad opening 15 includes a first pad opening 15a, which is formed in the passivation film 12 to expose a portion of the wiring film 10 as an electrode pad 14;

and a second pad opening 15b, which is formed in the resin film 13 to expose the electrode pad 14 and the first pad opening 15a.

The stress relaxation layer 112 is formed on the wiring film 10 to be electrically connected to the wiring film 10 (electrode pad 14). The stress relaxation layer 112 enters the first pad opening 15a from the passivation film 12, and is in contact with the wiring film 10 in the first pad opening 15a. The stress relaxation layer 112 has metal material whit a rigidity higher than those of the wiring film 10 and the pillar layer 114. The stress relaxation layer 112 includes a NiPd plating layer formed by electroplating or electroless plating. The thickness of the stress relaxation layer 112 is less than 10 μm, such as from 3 μm to 5 μm.

The UBM layer 113 includes, for example, a Ti film 116 and a Cu film 117 sequentially formed from the semiconductor chip 6 by sputtering. The thickness of the UBM layer 113 is less than the thickness of the stress relaxation layer 112, such as less than 1 μm.

The pillar layer 114 is, for example, a Cu plating layer formed in a block shape or a column shape by electroplating. The pillar layer 114 is formed as a body portion of the first electrode layer 111, and has a thickness less than 100 μm, such as from 30 μm to 60 μm. According to the pillar layer 114, the resistivity is reduced so as to facilitate the reduction of power consumption of the electrode 20.

The barrier layer 115 is, for example, a Ni plating layer formed on the pillar layer 114 by electroplating. The barrier layer 115 is disposed between the solder 23 and the pillar layer 114, thereby preventing the solder material of the solder 23 from diffusing into the pillar layer 114.

For example, when the pillar layer 114 is bonded to the solder 23 or when the semiconductor device 1 is mounted, the pillar layer 114 is heated. If the pillar layer 114 is heated, the pillar layer 114 generates stress along the element-forming surface 7 of the semiconductor chip 6 by thermal expansion. Therefore, in the case that there is no stress relaxation layer 112 formed, the existing stress is concentrated on the periphery of the wiring film 10 such that cracks may occur on the underlying semiconductor chip 6. Further, the pillar layer 114 may peel off from the pad opening 15 along with the thermal expansion.

Hence, in the variation according to FIG. 34, the stress relaxation layer 112 is disposed between the wiring film 10 and the pillar layer 114, and the stress relaxation layer 112 has metal material with a rigidity higher than those of the wiring film 10 and the pillar layer 114. Thus, the stress relaxation layer 112 is hard to be deformed by the stress due to the thermal expansion of the pillar layer 114 such that the stress delivered from the pillar layer 114 to the semiconductor chip 6 can be alleviated. Accordingly, the occurrence of cracks in the semiconductor chip 6, and the peel-off of the pillar layer 114 from the pad opening 15 can be prevented. Moreover, the occurrence of the cracks can be prevented through the stress relaxation layer 112; however, the pillar layer 114 can be thickened such that the increase in resistivity of the first electrode layer 111 can be prevented, and the resistivity of the first electrode layer 111 can be reduced.

Figure 35:
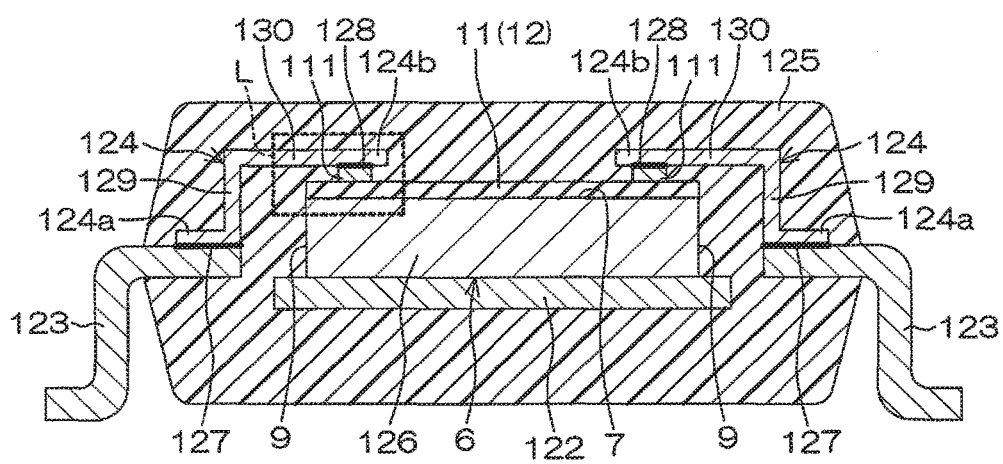
FIG. 35 is a cross-sectional view showing a semiconductor device in accordance with another example, wherein the semiconductor chip shown in FIG. 34, having the stress relaxation layer in the electrode structure, is applied to the semiconductor device.
Figure 36:
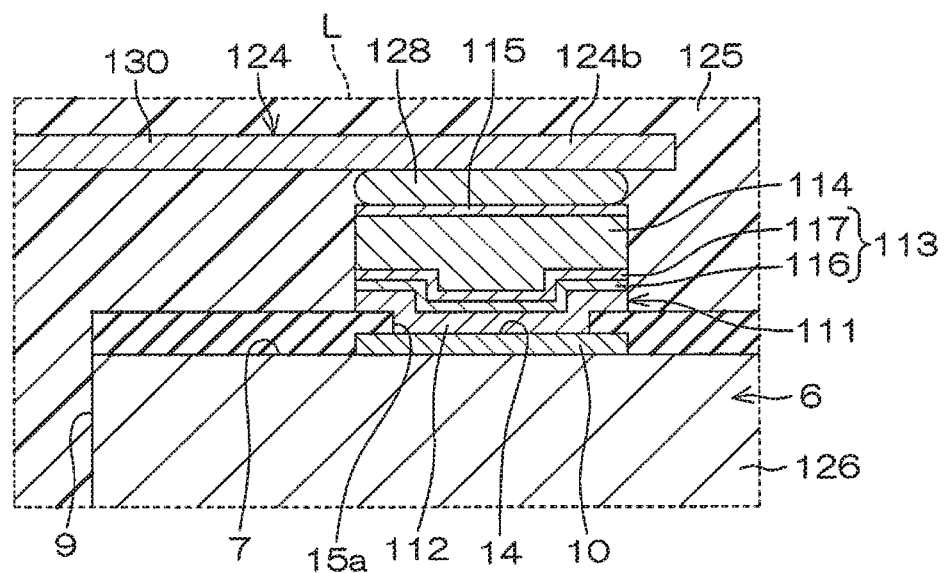
FIG. 36 is an enlarged cross-sectional view showing the portion surrounded by the dotted line shown in FIG. 35.

The semiconductor chip 6 having such stress relaxation layer 112 in the electrode structure can be used in various configurations of semiconductor devices. One example is shown in FIGS. 35 and 36. FIG. 35 is a cross-sectional view showing a semiconductor device 121 in accordance with another example, wherein the semiconductor chip 6 shown in FIG. 34, having the stress relaxation layer 112 in the electrode structure, is applied to the semiconductor device 121. FIG. 36 is an enlarged cross-sectional view showing the portion surrounded by the dotted line L shown in FIG. 35.

The semiconductor device 121 includes a die pad 122, a semiconductor chip 6 bonded on the die pad 122, a plurality of leads 123 disposed on the periphery of the die pad 122, a plurality of connecting members 124 for electrically connecting the leads 123 and the semiconductor chip 6, and a molding resin 125 for integrally sealing the above components.

The semiconductor chip 6 includes a substrate 126, a wiring film 10 formed on the substrate 126, an insulation film (passivation film 12) formed on the substrate 126 to expose a portion of the wiring film 10, and a first electrode layer 111 formed on and electrically connected to the wiring film 10. In such configuration, the first electrode layer 111 includes a pillar layer 114 formed on the wiring film 10, and a stress relaxation layer 112 disposed between the wiring film 10 and the pillar layer 114 for alleviating the stress delivered from the pillar layer 114 to the semiconductor chip 6. Further, the first electrode layer 111 includes an UBM layer 113 disposed between the stress relaxation layer 112 and the pillar layer 114, and a barrier layer 115 formed on the pillar layer 114.

The plurality of leads 123 can be disposed at two sides of the die pad 122, or at the periphery of the die pad for surrounding the die pad 122. A portion of the plurality of leads 123 is exposed from the molding resin 125 to be an external terminal for an external connection. In the molding resin 125, the plurality of leads 123 are electrically connected to the semiconductor chip 6 through the connecting member 124. Some of the plurality of leads 123 can be integrally formed with the die pad 122.

The plurality of the connecting members 124 have an end 124a for electrically connected to the lead 123 via a conductive bonding material 127, and the other end 124b for electrically connected to the pillar layer 114 via a conductive bonding material 128. The conductive bonding materials 127, 128 can also be solders including SnSb, SnAg or the like. Further, the conductive bonding material 128 can also be a SnSb plating layer preformed on the pillar layer 114 by electroplating. The thickness of the SnSb plating layer is less than 50 μm, for example, from 10 μm to 20 μm.

Any of the plurality of connecting members 124 consists of a conductive clip formed in a plate shape, and the connecting members 124 includes a erected portion 129 extending from the upper side of the lead 123 along the lateral side 9 of the semiconductor chip 6, and a horizontal portion 130 horizontally (in the direction parallel to the element-forming surface 7 of the semiconductor chip 6) protruding from the erected portion 129. Furthermore, the plurality of connecting members 124 can also include a bonding wire in addition to the conductive clip, or include a bonding wire to replace the conductive clip.

For example, when the plurality of connecting members 124 are bonded to the pillar layer 114 via the conductive bonding material 128, the pillar layer 114 is heated. If the pillar layer 114 is heated, the pillar layer 114 generates stress along the element-forming surface 7 of the semiconductor chip 6 due to thermal expansion. Hence, in the case that there is no stress relaxation layer 112 formed, there is a possibility of the concentration of the stress on the periphery of the wiring film 10 such that cracks may occur on the underlying semiconductor chip 6.

Therefore, in the semiconductor device 121, the stress relaxation layer 112 is disposed between the wiring film 10 and the pillar layer 114, and the stress relaxation layer 112 has metal material with a rigidity higher than those of the wiring film 10 and the pillar layer 114. Thus, the stress relaxation layer 112 is hard to be deformed by the stress due to the thermal expansion of the pillar layer 114, such that the stress delivered from the pillar layer 114 to the semiconductor chip 6 can be alleviated. Accordingly, the occurrence of cracks in the semiconductor chip 6 can be prevented. Moreover, the occurrence of the cracks can be prevented by the stress relaxation layer 112; however, the pillar layer 114 can be thickened, such that the increase in resistivity of the first electrode layer 111 can be prevented, and the resistivity of the first electrode layer 111 can be reduced.

Further, in the embodiment shown in FIGS. 35 and 36, the connection between the connecting member 124 and the semiconductor chip 6 is illustrated. However, the semiconductor chip 6 can also be directly mounted on a mounting substrate, which is a connecting object. In this case, the semiconductor chip 6 can also be flip-chip bonded on the mounting substrate by bonding the first electrode layer 111 to the mounting substrate via the conductive banding material 128.

Figure 5:
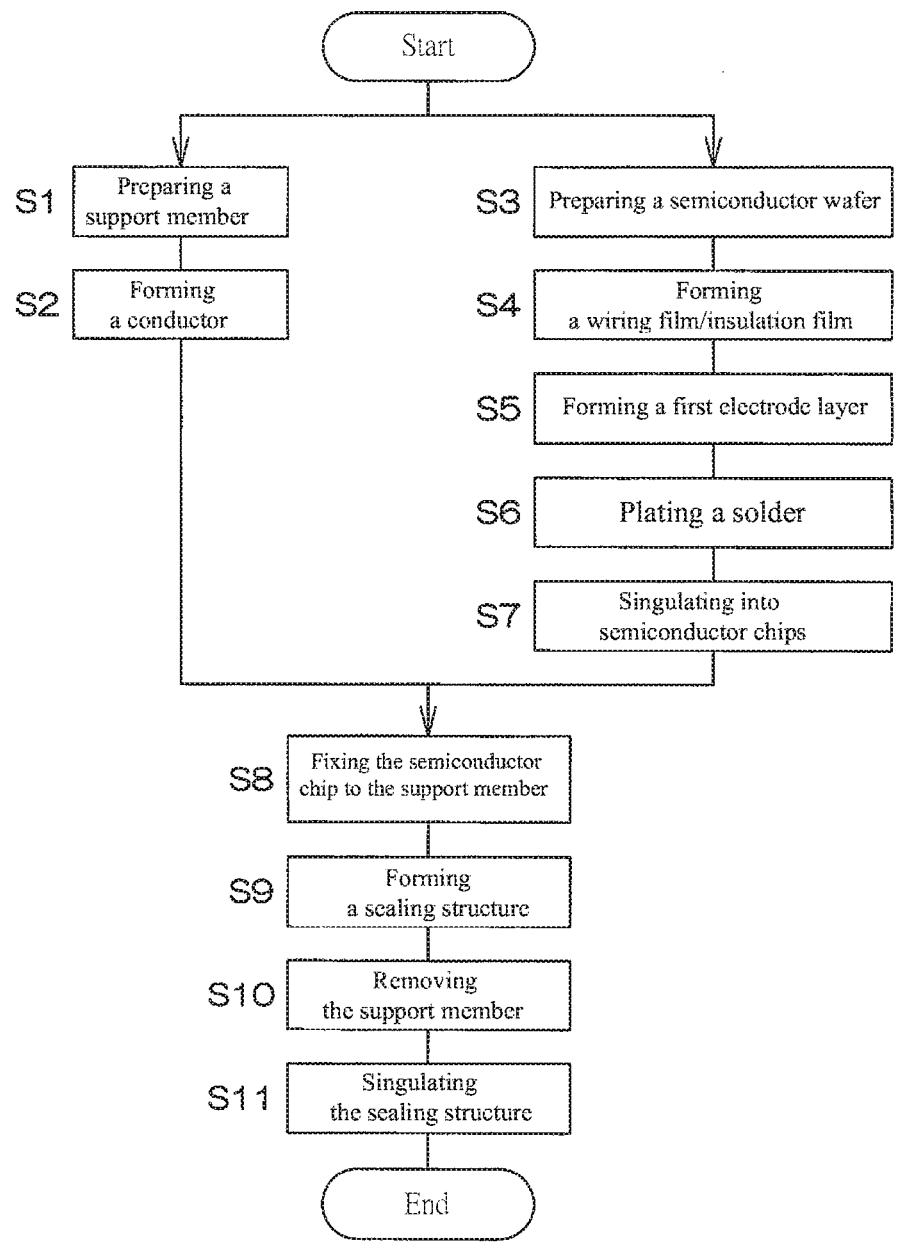
FIG. 5 is a flow chart showing steps of an exemplary method for manufacturing the semiconductor device shown in FIG. 1.
Figure 6:
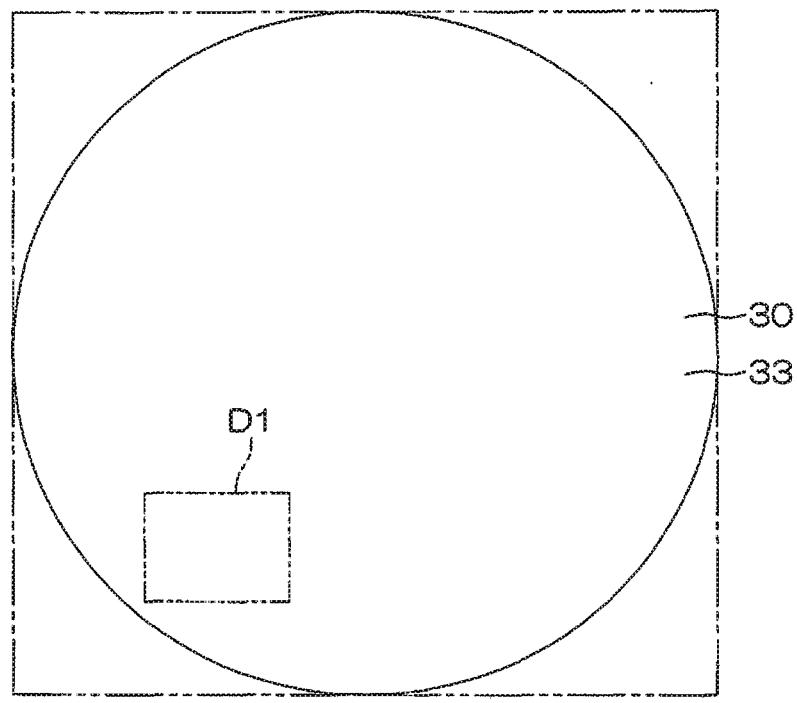
FIG. 6 is a top view showing a support member used in the method for manufacturing the semiconductor device shown in FIG. 1.
Figure 7:
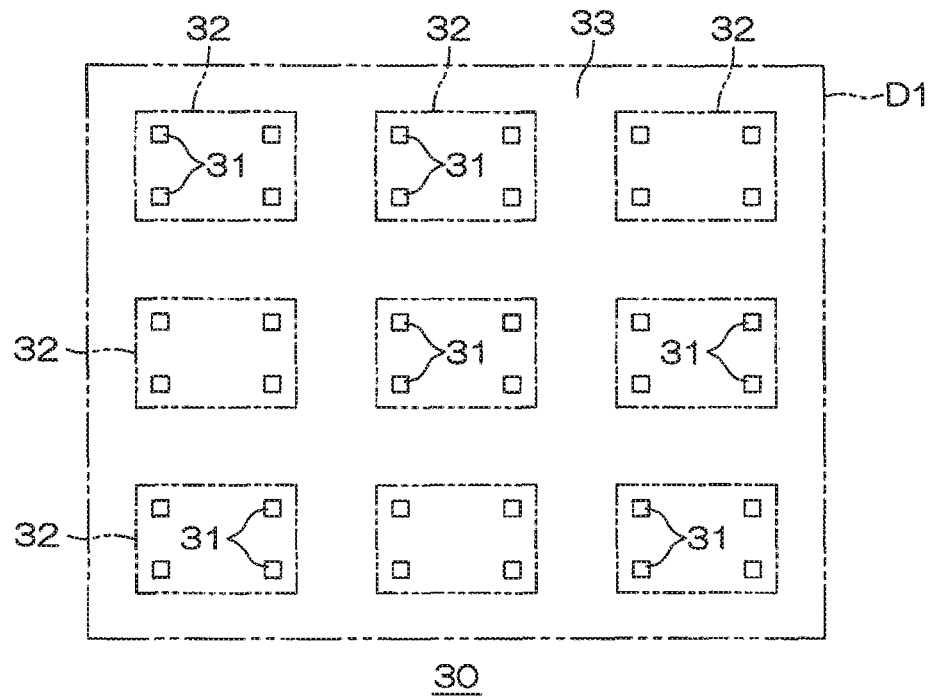
FIG. 7 is an enlarged top view showing an area surrounded by the dotted line shown in FIG. 6.
Figure 8:
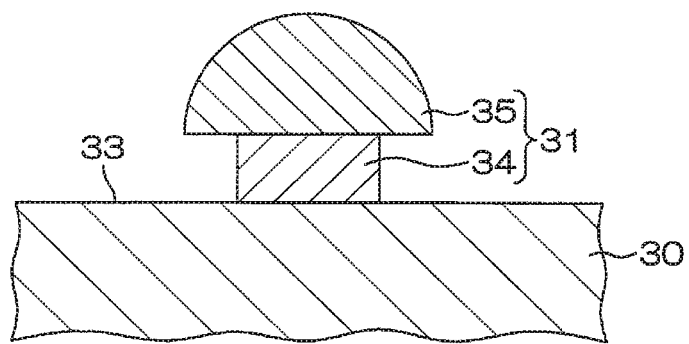
FIG. 8 is a cross-sectional view showing an exemplary shape of the conductor.
Figure 9:
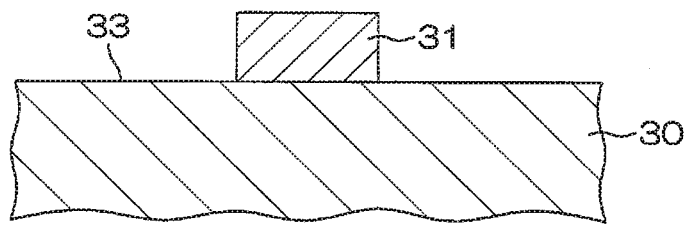
FIG. 9 is a cross-sectional view showing another exemplary shape of the conductor.
Figure 10:
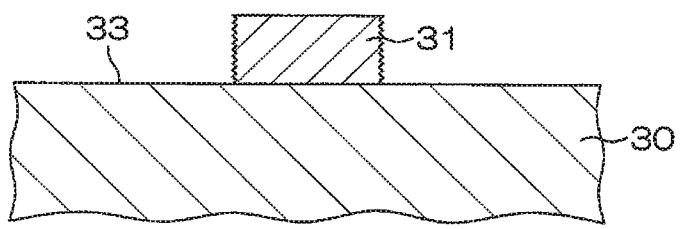
FIG. 10 is a cross-sectional view showing another exemplary shape of the conductor.
Figure 11:
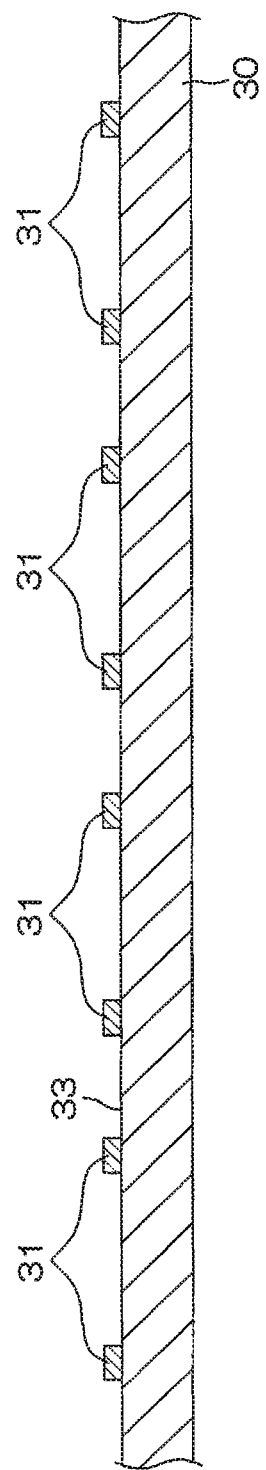
FIG. 11 is a cross-sectional view showing the support member shown in FIG. 6.

FIG. 5 is a flow chart showing the steps of the method for manufacturing the semiconductor device 1 shown in FIG. 1. FIG. 6 is a top view showing the support member 30 used in the method for manufacturing the semiconductor device 1 shown in FIG. 1. FIG. 7 is an enlarged top view showing the area D1 surrounded by the dotted line shown in FIG. 6. FIGS. 8 to 10 are cross-sectional views showing the shape of the conductor 31. FIG. 11 is a cross-sectional view showing the support member 30 shown in FIG. 6.

Before manufacturing the semiconductor device 1, as shown in FIG. 6, first, a support member 30 is prepared (step S1: preparing a support member). In this embodiment, the top view of the support member 30 is a circular plate with a substantially circular shape (referring to the solid line in FIG. 6). Instead of the circular plate with the substantially circular shape, the top view of the support member 30 can be a plate with a substantially rectangular shape (referring to the two-dotted chain line in FIG. 6). Preferably, the support member 30 can be a plate member, which can be removed from the seal resin 3 (by peeling and/or etching). The plate member, which can be peeled from the seal resin 3, preferably is a plate member includes stainless steel or copper. However, the plate member, which can be removed from the seal resin 3 by etching, can be a semiconductor plate. The semiconductor plate can also be a silicon wafer.

As shown in FIG. 7, a plurality of chip arrangement areas 32 (referring to the two-dotted chain line in FIG. 7) are designed on a surface of the support member 30, i.e. a pattern-forming surface 33, for having a plurality of semiconductor chips 6 disposed thereon in the subsequent steps. In this embodiment, the plurality of chip arrangement areas 32 are set as a matrix having rows orthogonal to columns at intervals from each other.

After the support member 30 is prepared, a conductor 31 is formed on the pattern-forming surface 33 of the support member 30 (step S2: forming a conductor). In this embodiment, on each of the chip arrangement areas 32, a plurality of conductors 31 (four conductors in this embodiment) are formed at intervals from each other. At this time, the conductors 31 can be formed and include a copper film, a gold film or a nickel film. Instead, the conductors 31 including a laminated film can be formed, wherein the laminated film includes a gold film formed on the support member 30 and a nickel film formed on the gold film.

In FIG. 8, in the cross-sectional view, the conductor 31 can include a lower portion 34 with a substantially rectangular shape, and an upper portion 35 with a substantially arced shape. The width of the upper portion 35 of the conductor 31 is larger than the width of the lower portion 34 of the conductor 31. The lower portion 34 and the upper portion 35 of the conductor 31 can include the same or different conductive materials. In the case that the conductor 31 includes different conductive materials, for example, the lower portion 34 of the conductor 31 can be a gold film, and the upper portion 35 of the conductor 31 can be a nickel film. However, as shown in FIG. 9, in the cross-sectional view, the conductor 31 also can have a flat upper edge and a flat lateral edge.

Further, in FIG. 10, in the cross-sectional view, conductor 31 can have a flat upper surface, and a lateral side with a rough surface (uneven surface). The lateral side with the rough surface (uneven surface) can be formed by, for example, the conductor 31 including a flat lateral side is formed, and then a treatment of Ni-plating on the flat lateral side is performed to form a rough surface. Alternatively, the lateral side with the rough surface (uneven surface) can be formed by, for example, forming the conductor 31 including a flat lateral side, and then performing a plasma-etching on the flat lateral side.

As a result, as shown in FIG. 11, a support member 30 having a conductor 31 formed on the pattern-forming surface 33 is prepared (also referring to FIG. 7). Also, a semiconductor chip 6 disposed on the support member 30 is prepared.

Figure 12:
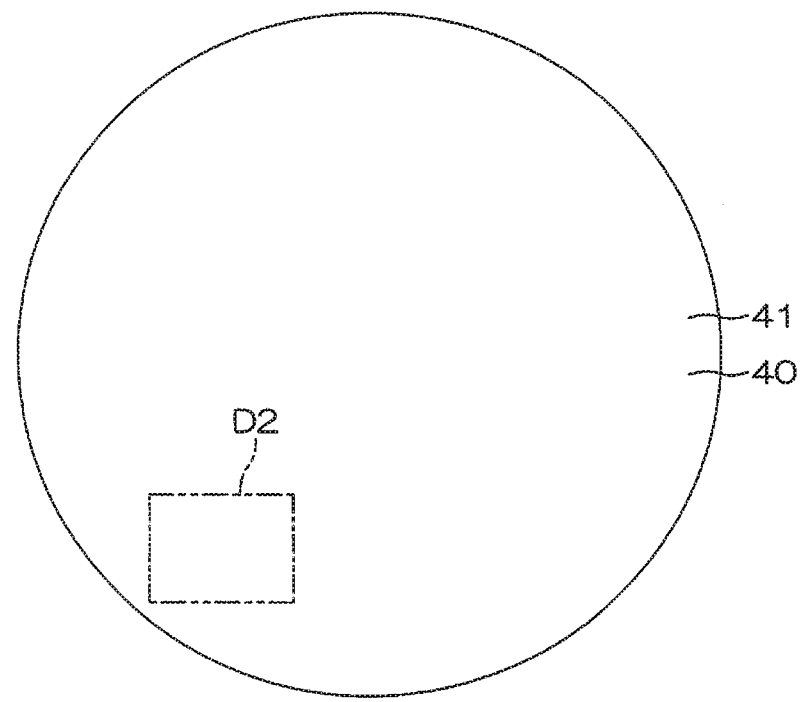
FIG. 12 is a top view showing the semiconductor wafer used in the method for manufacturing the semiconductor device shown in FIG. 1.
Figure 13:
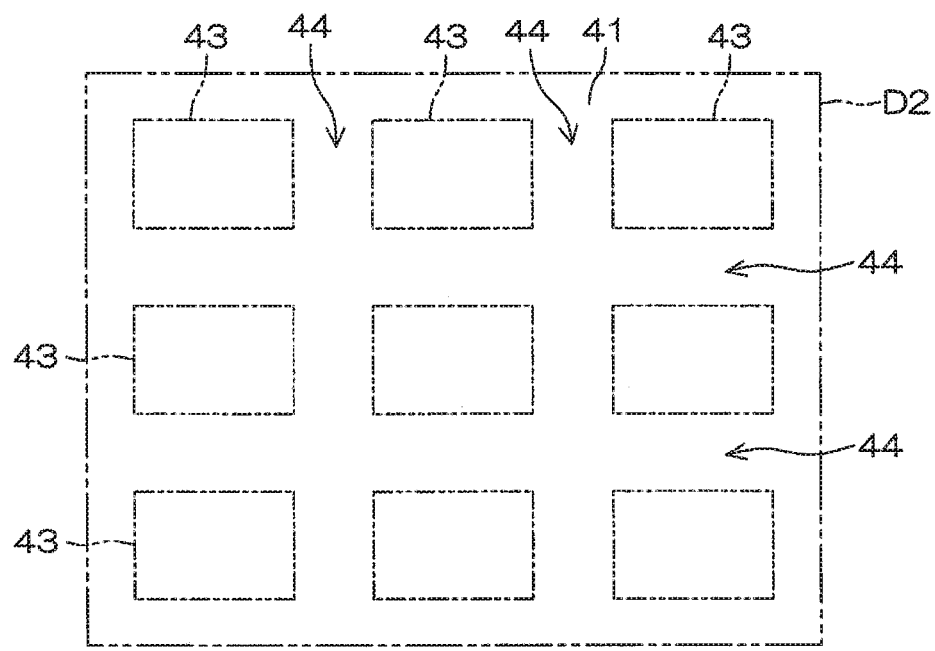
FIG. 13 is an enlarged top view of an area surrounded by the dotted line shown in FIG. 12.
Figure 14:
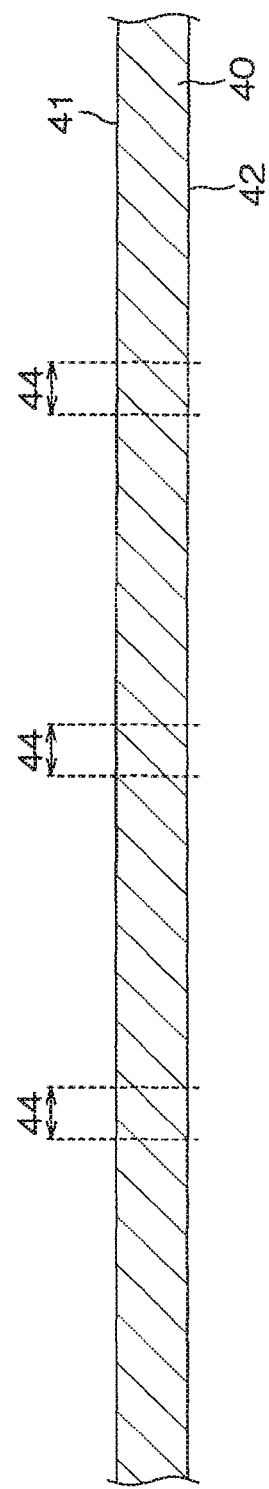
FIG. 14 is a cross-sectional view showing the semiconductor wafer shown in FIG. 12.

FIG. 12 is a top view showing the semiconductor wafer 40 used in the method for manufacturing the semiconductor device 1 shown in FIG. 1. FIG. 13 is an enlarged top view of the area D2 surrounded by the dotted line shown in FIG. 12. FIG. 14 is a cross-sectional view showing the semiconductor wafer 40 shown in FIG. 12. FIGS. 15 to 20 are cross-sectional views showing the steps subsequent to FIG. 14.

As shown in FIGS. 12 to 14, first, a semiconductor wafer 40 is prepared (step S3: preparing a semiconductor wafer). For example, the top view of the semiconductor wafer 40 is a substantially circular plate. The front side 41 of the semiconductor wafer 40 is corresponding to the element-forming surface 7 of the semiconductor chip 6, and the back side 42 of the semiconductor wafer 40 is corresponding to the back side 8 of the semiconductor chip 6.

As shown in FIG. 13, on the front side 41 of the semiconductor wafer 40, the chip areas 43 corresponding to the plurality of semiconductor chips 6 are arranged as a matrix having rows orthogonal to columns at intervals from each other. The semiconductor elements are respectively formed on each chip area 43. A bordering area 44 is disposed between adjacent chip areas 43 for a cutting line to pass through. The bordering area 44 is an area in a band shape with a substantially fixed width, and the bordering areas 44 form a lattice along two directions orthogonal to each other.

Figure 15:
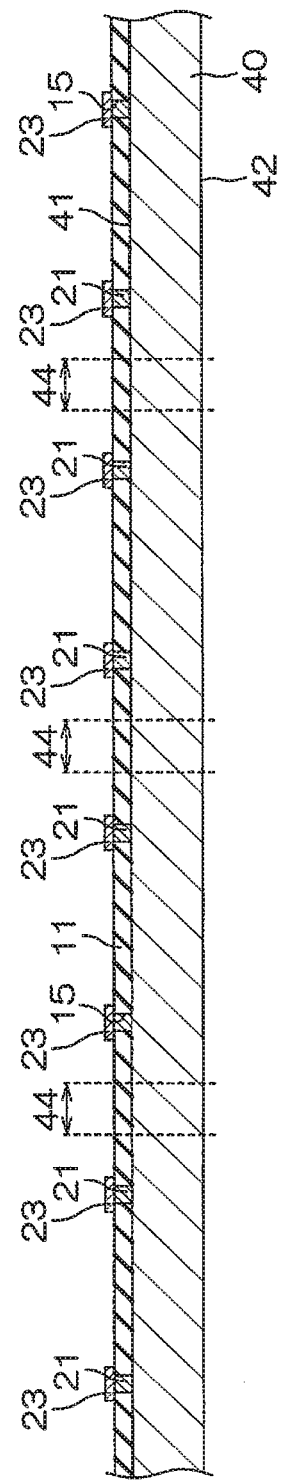
FIG. 15 is a cross-sectional view showing the next step of FIG. 14.

Then, as shown in FIG. 15, a wiring film 10, an insulation film 11, a first electrode layer 21 and a solder 23 are formed on the front side 41 of the semiconductor wafer 40 (also referring to FIG. 4). More specifically, first, an aluminum film is formed on the semiconductor wafer 40. Then, the wiring film 10 is formed on the front side 41 of the semiconductor wafer 40 for electrically connected to the semiconductor element by pattering the aluminum film (step S4: forming a wiring film/insulation film). Then, a passivation film 12 is formed to cover the wiring film 10. Subsequently, a resin film 13, such as photo-sensitive polyimide, is applied on the passivation film 12. The resin film 13 is developed after being exposed to the pattern corresponding to the pad opening 15. Then, according to the requirements, a heat treatment is performed to cure the resin film 13. Subsequently, the resin film 13 is used as a mask, and unnecessary portions of the passivation film 12 are removed by etching. Accordingly, the insulation film 11 is formed with a pad opening 15 for exposing a portion of the wiring film 12 as an electrode pad 14.

Then, a first electrode layer 21 is formed to backfill the pad opening 15 and cover the insulation film 11 by, for example, sputtering (step S5: forming a first electrode layer). Subsequently, the unnecessary portions of the first electrode layer 21 formed on the insulation film 11 is removed by etching back. Accordingly, the first electrode layer 21 is buried in the pad opening 15. The first electrode layer 21, for example, can be a nickel film. Then, the solder 23 is formed on the first electrode layer 21 by electroless plating or electroplating (step S6: plating a solder).

Figure 16:
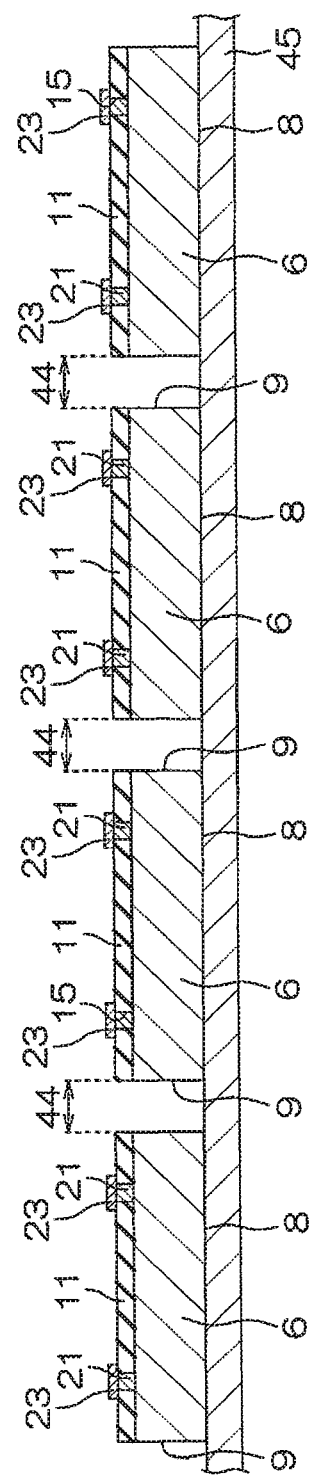
FIG. 16 is a cross-sectional view showing the next step of FIG. 15.

Subsequently, as shown in FIG. 16, the chip area 43 is singulated into semiconductor chips 6 (step S7: singulating into semiconductor chips). More specifically, first, a support tape 45 with an adhesive surface is adhered to the front side 41 or back side 42 on the semiconductor wafer 40, and then the semiconductor wafer 40 is fixed onto the support tape 45. In this embodiment, the support tape 45 is adhered to the back side 42 of the semiconductor wafer 40.

Then, while the semiconductor wafer 40 is fixed to the support tape 45, the semiconductor wafer 44 is cut from the front side 41 toward the back side 42 of the semiconductor wafer 40 along the bordering area 44 between the chip areas 43. The semiconductor wafer 40 can be cut by a dicing blade or cut by removing the bordering area 44 through etching. Accordingly, the semiconductor wafer 40 is singulated into a plurality of semiconductor chips 6.

Figure 17:
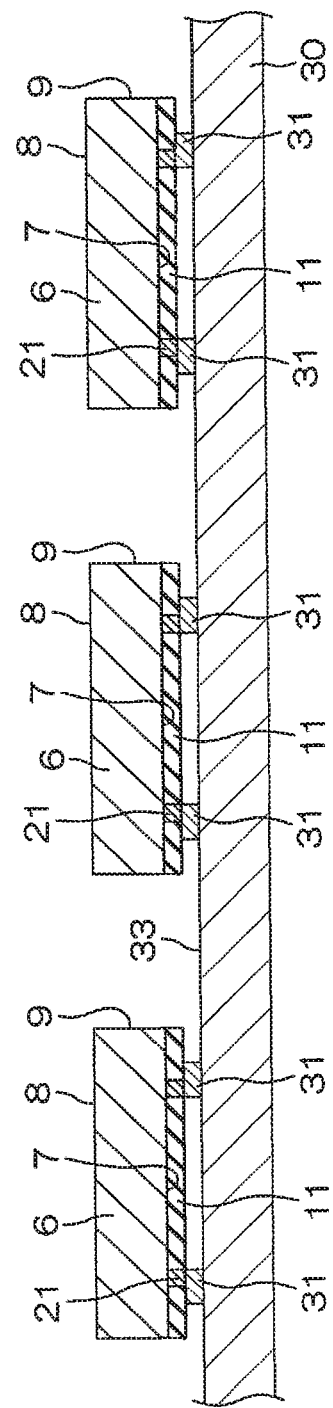
FIG. 17 is a cross-sectional view showing the next step of FIG. 16.

Then, as shown in FIG. 17, the first electrode layer 21 of the semiconductor chip 6 is bounded to the conductor 31 of the support member 30 through the solder 23 (referring to FIGS. 4, 16 and etc.) (step S8: fixing the semiconductor chip to the support member).

More specifically, while the element-forming surface 7 of the semiconductor chip 6 faces the pattern-forming surface 33 of the support member 30, the first electrode layer 21 formed on the semiconductor 6 is fixed to the conductor 31 formed on the support member 30 through the solder 23. In other words, the semiconductor chip 6 is flip-chip bonded to the support member 30. The conductor 31 formed on the support member 30 is electrically connected to the semiconductor chip 6 through the solder 23 and the first electrode layer 21. Each semiconductor chip 6 is deposed at interval from the pattern-forming surface of the support member 30 through the conductor 31 formed on the support member 30, and fixed at a specific height. Accordingly, there is a gap formed between each semiconductor chip 6 and the support member 30.

Figure 18:
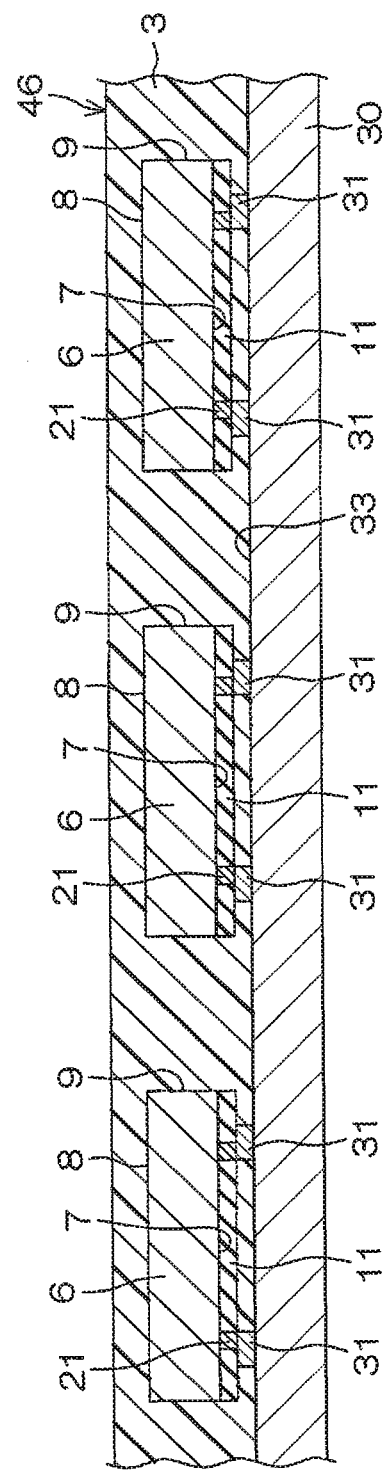
FIG. 18 is a cross-sectional view showing the next step of FIG. 17.

Subsequently, as shown in FIG. 18, while each semiconductor chip 6 is fixed on the support member 30, the plurality of semiconductor chips are coated collectively through sealing resin, for example, by epoxy resin coating or molding(step S9: forming a sealing structure). At this time, each semiconductor chip 6 is sealed so as to fill the gap between the support member 30 and each semiconductor chip 6, and cover the lateral side 9 and the back side 8 of each semiconductor chip 6 through the sealing resin 3. Alternatively, the gap between the support member 30 and each semiconductor chip 6 can be filled with the sealing resin 3 by an underfill. Then, the sealing resin 3 is heated, such that the sealing resin 3 is hardened. Accordingly, the conductor 31 and the semiconductor chip 6 are covered together by the sealing resin 3, and thus the plurality of semiconductor chips are collectively sealed through the sealing resin 3 to form a sealing structure 46.

Figure 19:
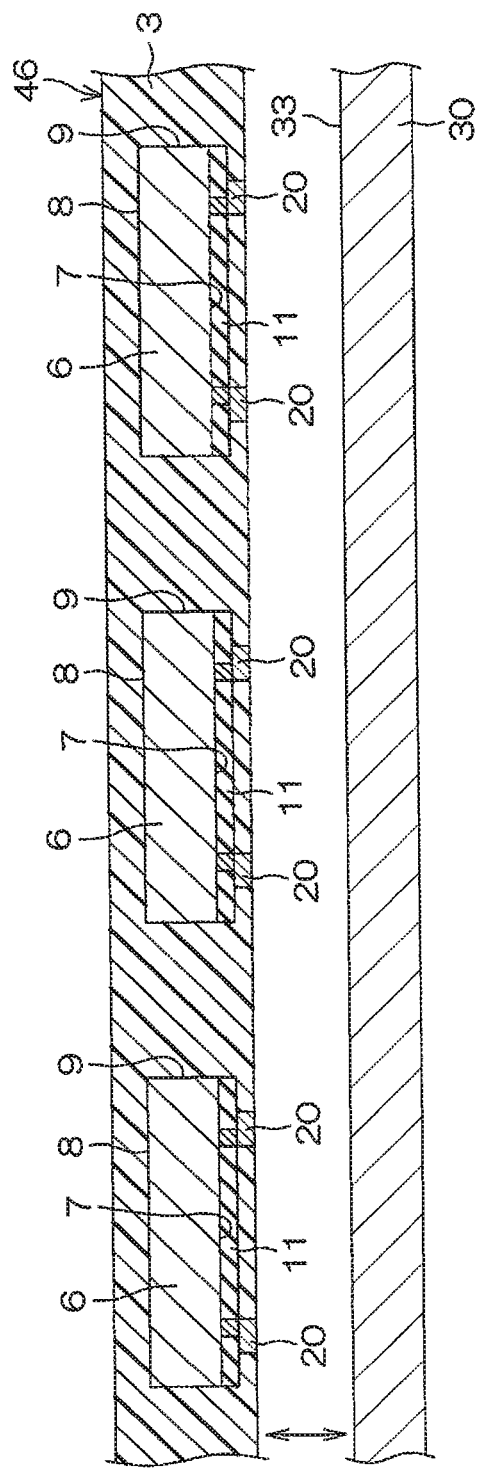
FIG. 19 is a cross-sectional view showing the next step of FIG. 18.

Then, as shown in FIG. 19, the support member 30 is removed from the sealing structure 46 (step S10: removing the support member). In the case that the support member 30 is a metal plate including stainless steel or copper, the metal plate is peeled from the sealing structure 46. On the other hand, in the case that the support member 30 is a semiconductor plate, the semiconductor plate is removed by etching. The conductor 31 formed on the support member 30 is transferred to the sealing structure 46 by removing the support member 30 from the sealing structure 46. The connecting portion of the conductor 31 transferred to the sealing structure 46 with respect to the support member 30 is exposed from the sealing structure 46. The transferred conductor 31 is used as a second electrode layer 22. Further, the connecting portion of the conductor 31 with respect to the support member 30 is used as an external terminal 5. Accordingly, an electrode 20 including the first electrode layer 21, the second electrode layer 22 and the solder 23 is formed.

Figure 20:
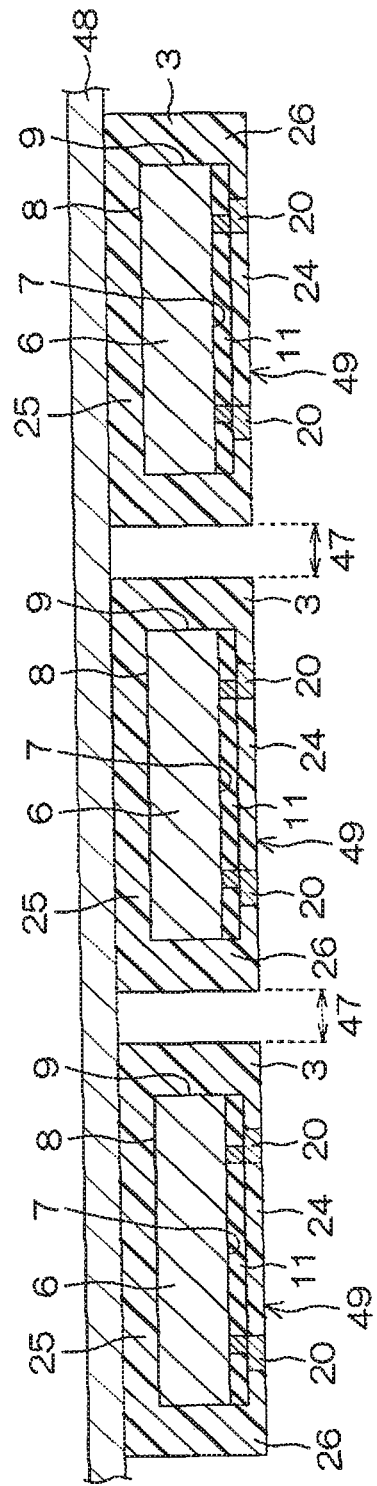
FIG. 20 is a cross-sectional view showing the next step of FIG. 19.

Subsequently, as shown in FIG. 20, the sealing structure 46 is cut along the cutting line 47 disposed between the plurality of semiconductor chips 6 (step S11: singulating the sealing structure). More specifically, one of the front side and the back side of the sealing structure 46 is fixed on an adhesive surface of a flexible tape 48. In this embodiment, the front side of the sealing structure 46 is fixed on the flexible tape 48. While the sealing structure 46 is fixed on the flexible tape 48, the sealing structure 46 is cut. The sealing structure 46 can be cut by a dicing blade or etching. Accordingly, the sealing structure 46 is singulated into a plurality of sealing structure bodies 50 including the semiconductor chips 6. Hence, a semiconductor device 1 is formed.

According to the above method, while the element-forming surface 7 of the semiconductor chip 6 and the pattern-forming surface 33 of the support member 30 face each other, the first electrode layer 21 formed on the semiconductor chip 6 is bonded to the conductor 31 formed on the support member 30 through the solder 23. In other words, the semiconductor chip 6 is flip-chip bonded to the support member 30. The conductor 31 formed on the support member 30 is electrically connected to the semiconductor chip 6 through the solder 23 and the first electrode layer 21 formed on the semiconductor chip 6. During this step, the semiconductor chip 6 is coated by the sealing resin 3, and thus the sealing structure 46, having the semiconductor chip 6 sealed through the sealing resin 3, is formed.

Then, the conductor 31 is transferred to the sealing structure 46 by removing the support member 30. The connecting portion of the conductor 31 transferred to the sealing structure 46 with respect to the support member 30 is exposed from the sealing structure 46. The conductor 31 exposed from the sealing structure 46 can be used as an external terminal 5 capable of electrically connected to the outside of the sealing structure 46.

The following method is considered as a comparative example. After the semiconductor chip 6 and the first electrode layer 21 are coated together through the sealing resin 3 to form the sealing structure 46, the sealing resin 3 is ground till the first electrode layer 21 is exposed, and thus the external terminal 5 is formed for electrically connected to the sealing structure 46. In the case of the comparative example, the thickness of the sealing resin 3 for covering the first electrode layer 21 has to be adjusted, and it is time-consuming to precisely control the time and depth for grinding the sealing resin 3.

In the method according to the embodiment, after the semiconductor chip 6 is coated through the sealing resin 3 to form the sealing structure 46, the support member 30 is removed, thereby the conductor 31 exposed from the sealing structure 46 can be formed. Therefore, there is no need to grind the sealing resin 3. Accordingly, the manufacturing process can be simplified. Further, in the method according to the embodiment, in the sealing structure 46, there is no need to place the semiconductor chips 6 on a lead frame and connect the semiconductor chips 6 to a lead terminal via bounding wires. Hence, in the present invention, the number of components can be reduced, and thus the manufacturing cost of the semiconductor device 1 can be reduced. Further, the sealing resin 3 coating the semiconductor chip 6 also serves as the package body 2, such that the minimization of the semiconductor device 1 also can be achieved.

Furthermore, in the method according to the embodiment, after the plurality of semiconductor chips 6 are collectively sealed through the sealing resin 3 to form the sealing structure 46, the sealing structure 46 is singulated into a plurality of sealing structure bodies. One singulated sealing structure body 50 is one semiconductor device 1. Hence, the step of forming a sealing structure 46 can be performed in common to a plurality of semiconductor chips, and thus the manufacturing efficiency can be improved. Accordingly, the manufacturing cost of the semiconductor device 1 can be further reduced.

Moreover, according to this method of the present invention, a Fan-in semiconductor device 1, with an external terminal 5 formed in the area surrounded by lateral sides 9 of the semiconductor chip 6 in the top view, can be manufactured. Further, the step of transferring the conductor 31 to the sealing structure 46 also serves as the step of forming the external terminal 5 thereby the increment of the manufacturing process can be avoided, and the easily manufactured semiconductor device 1 can be provided.

Further, when the support member 30 is a metal plate including stainless steel or copper, the metal plate can be well peeled from the sealing structure 46. On the other hand, when the support member 30 is a semiconductor plate, the semiconductor plate can be well removed by etching. In any one of the above conditions, the conductor 31 can be well transferred to the sealing structure 46 without complicating the manufacturing process.

<Second Embodiment>

Figure 21:
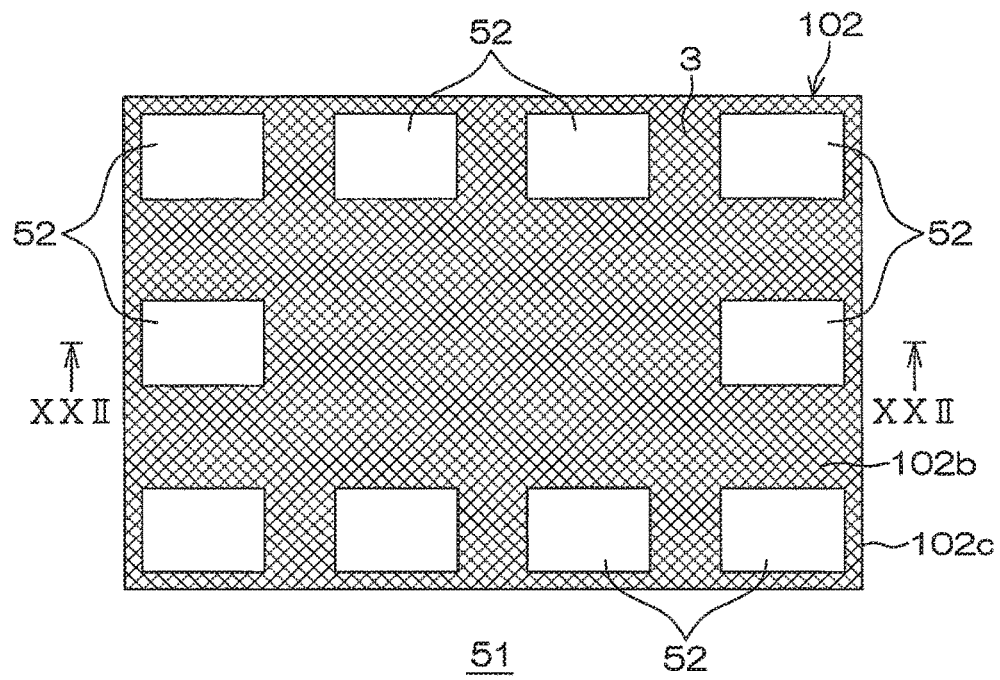
FIG. 21 is a bottom view of a semiconductor device in accordance with the second embodiment of the present invention.
Figure 22:
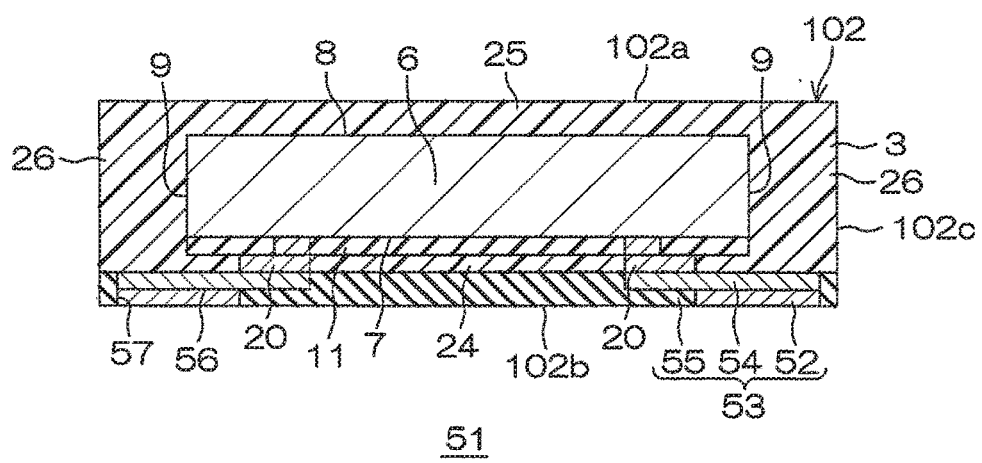
FIG. 22 is a cross-sectional view along the line XXII-XXII shown in FIG. 21.

FIG. 21 is a bottom view showing the semiconductor device 51 according to the second embodiment of the present invention. FIG. 22 is a cross-sectional view along the line XXII-XXII shown in FIG. 21. In FIGS. 21 and 22, similar portions corresponding to portions shown in FIGS. 1 to 20 have similar reference numerals, and the associated descriptions are omitted. If necessary, refer to FIG. 1. In FIG. 21, a package body 102 is indicated by cross-hatching for clarity.

As shown in FIG. 21, a semiconductor device 51 includes a package body 102 instead of the package body 2 according to the semiconductor device 1. For example, the package body 102 is formed in a substantially rectangular shape, and includes a front side 102a, a back side 102b and four lateral sides 102c. The four lateral sides 102c are respectively connected to the front side 102a and the back side 102b. A label 4 can be formed on the front side 102a of the package body 102(referring FIG. 1).

On the back side 102b of the package body 102, a plurality of external terminals 52 (ten external terminals in this embodiment) are formed to be exposed from the package body 102. The external terminals 52 are disposed at intervals from each other, and respectively formed in a substantially rectangular shape. Each external terminal 52 is formed along the lateral side 102c of the package body 102. Each external terminal 52 is formed from the lateral side 102c toward the inner side of the package body 102 at intervals.

As shown in FIG. 22, the semiconductor device 51 includes a rewiring structure 53 formed on the back side 24 of the sealing resin 3. In other words, the whole rewiring structure 53 is exposed from the sealing resin 3. More specifically, the rewiring structure 53 includes a rewiring 54 electrically connected to the electrode 20 and formed on the sealing resin 3 to be routed from the electrode 20; a back side insulation film 55 for covering the rewiring 54; and an external terminal 52 for electrically connected to the rewiring 54.

The rewiring 54 is extended on the back side 24 of the sealing resin 3 from the electrode 20. In the top view, the rewiring 54 is formed to cross the lateral side 9 of the semiconductor 6 and reach the periphery 26 of the sealing resin 3. The rewiring 54 includes an end, in the top view, disposed in the area surrounded by the lateral sides 9 of the semiconductor chip 6 and electrically connected to the electrode 20; and the other end, in the top view, disposed on the periphery portion 26 of the sealing resin 3 outside the area surrounded by the lateral sides 9 of the semiconductor chip 6. The rewiring 54, for example, can be a copper wiring.

The back side insulation film 55 is formed on the back portion 24 of the sealing resin 3 to cover the rewiring 54. The back side insulation film 55 can be an insulation film, such as a nitride film, or a resin film, such as polyimide. The back side 102b of the package body 102 is formed by the back side insulation film 55. Further, the lateral side 102c of the package body 102 is formed by the periphery portion 26 of the sealing resin 3 and the back side insulation film 55. A pad opening 57 for exposing a portion of the other end of the rewiring 54 as an electrode pad 56 is formed in the back side insulation film 55.

The external terminal 52 is buried in the pad opening 57 of the back side insulation film 55. Preferably, at least a portion of the external terminal 52 is located in an area outside the semiconductor chip 6. The whole external terminal 52 can also be formed in an area outside the lateral side 9 of the semiconductor chip 6. The external terminal 52 faces the periphery portion 26 of the sealing resin 3 with the rewiring 54 interposed therebetween. The external terminal 52 can has a surface being coplanar with the surface of the back side insulation film 55. The external terminal 52 is electrically connected to the semiconductor chip 6 via the wiring 54 and the electrode 20. The external terminal 52, for example, includes a copper film, a gold film or a nickel film. The external terminal 52 can also be a laminated film including a gold film formed on the wiring 54 and a nickel film formed on the gold film.

Further, while a portion of the external terminal 52 is, in the top view, located in an area outside the semiconductor chip 6, the external terminal 52, in the cross-sectional view, faces the periphery portion of the sealing resin 3 and a portion of the semiconductor chip 6, with the wiring 54 interposed therebetween.

Figure 23:
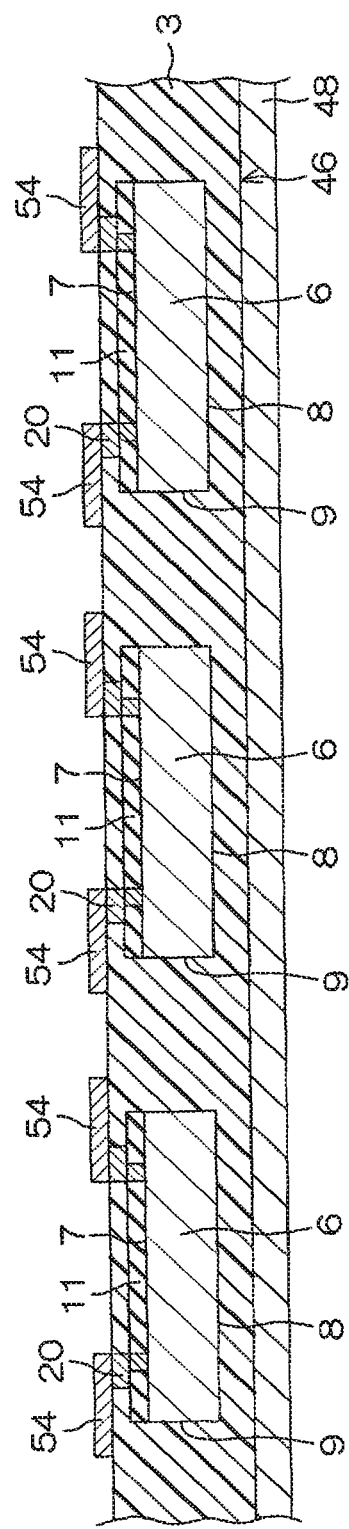
FIG. 23 is a cross-sectional view showing an exemplary method for manufacturing the semiconductor device shown in FIG. 21.
Figure 24:
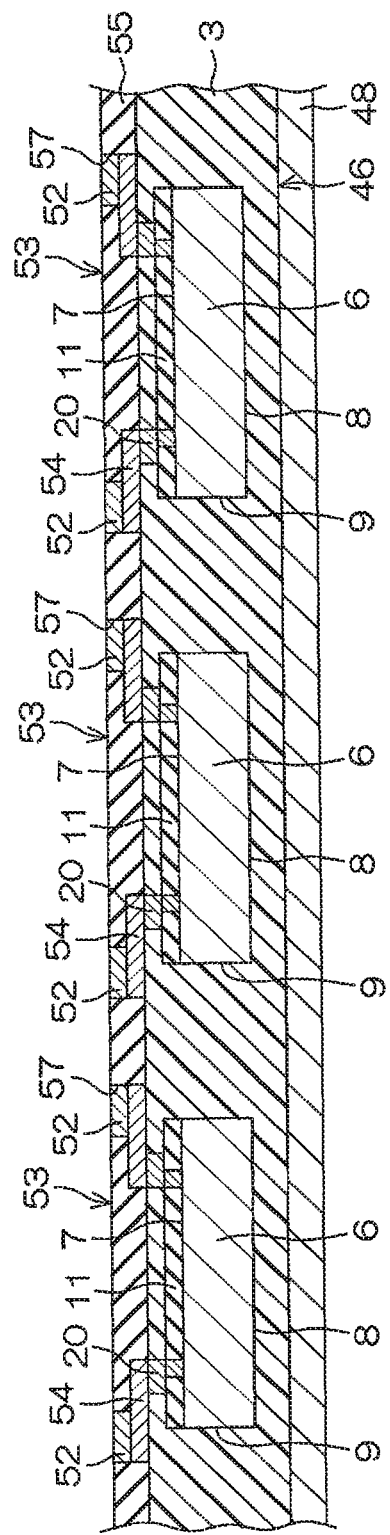
FIG. 24 is a cross-sectional view showing the next step of FIG. 23.
Figure 25:
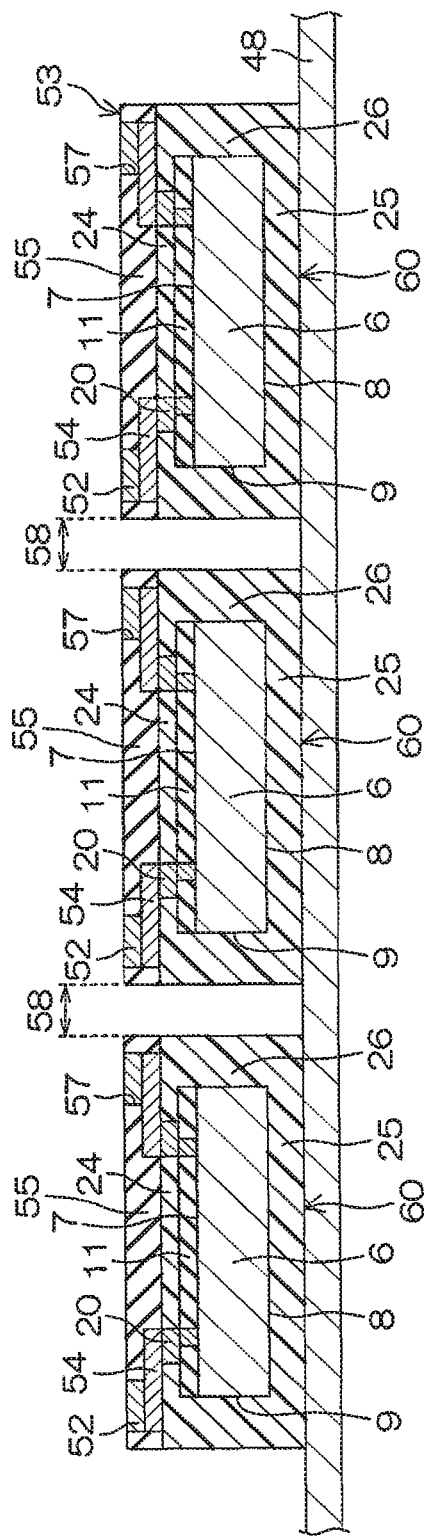
FIG. 25 is a cross-sectional view showing the next step of FIG. 24.

FIGS. 23 to 25 are cross-sectional views showing an example of the method for manufacturing the semiconductor device 51 shown in FIG. 21. If necessary, refer to FIGS. 4 and 19.

In the manufacturing of the semiconductor device 51, first, the sealing structure 46 with the flexible tape 48 fixed on the front side is prepared by the step S10 of removing the support member 30 (referring to FIGS. 4 and 19). Then, the rewiring structure 53 is formed on the back side of the sealing structure 46.

More specifically, as shown in FIG. 23, while the sealing structure 46 is fixed on the flexible tape 48, a copper film is formed on the back side of the sealing structure 46, for example, by sputtering. Then, the copper film is patterned to form the rewiring 54, for example, by photolithography and etching.

Then, as shown in FIG. 24, a nitride film is laminated on the back side of the sealing structure 46 to form the back side insulation film 55, for example, by chemical vapor deposition (CVD). Then, a resist mask (not shown) is formed on the back side insulation film 55, and the resist mask selectively has an opening in an area where an electrode pad 56 is to be formed. By etching via the resist mask, the pad opening 57 for exposing a portion of the wiring 54 as the electrode pad 56 is formed in the back side insulation film 55. After the pad opening 57 is formed, the resist mask is removed.

Then, a nickel film and a gold film are formed sequentially in the pad opening 57 by, for example, electroless plating or electroplating so as to form an external terminal 52. Accordingly, a rewiring structure 53 including a plurality of rewirings 54 corresponding to the plurality of electrodes 20 is formed on the back side of the sealing structure 46.

Then, as shown in FIG. 25, the back side insulation film 55 and the sealing structure 46 are cut along the cutting line 58 disposed between a plurality of semiconductor chips 6, more specifically, between adjacent rewiring structures 53. Accordingly, the sealing structure 46 is singulated into a plurality of sealing structure bodies 60 including the semiconductor chips 6. In this embodiment, one singulated sealing structure body 60 includes one semiconductor chip 6. Hence, the semiconductor device 51 is manufactured.

According to the above method, the rewiring structure 53 can be formed by using the method according to the first embodiment. Through the rewiring structure 53, the flexibly in design to the arrangement of the external terminal 52 can thus be improved.

More specifically, according to the method of this embodiment, the periphery portion 26 of the sealing resin 3 is formed so as to coat the lateral side 9 of the semiconductor chip 6, such that in the top view, an area in the periphery portion 26 of the sealing resin 3 outside the semiconductor chip 6 can be used as an area for forming the rewiring 54. Therefore, the area where the external terminal 52 formed to be electrically connected to the rewiring 54 is not limited to the area directly above the element-forming surface 7 of the semiconductor chip 6. Accordingly, a Fan-out semiconductor device 51 with the external terminal 52 formed in an area outside the semiconductor chip 6 can be manufactured. Hence, a minimized semiconductor device 51 with multiple external terminals 52 can be manufactured.

<Third Embodiment>

Figure 26:
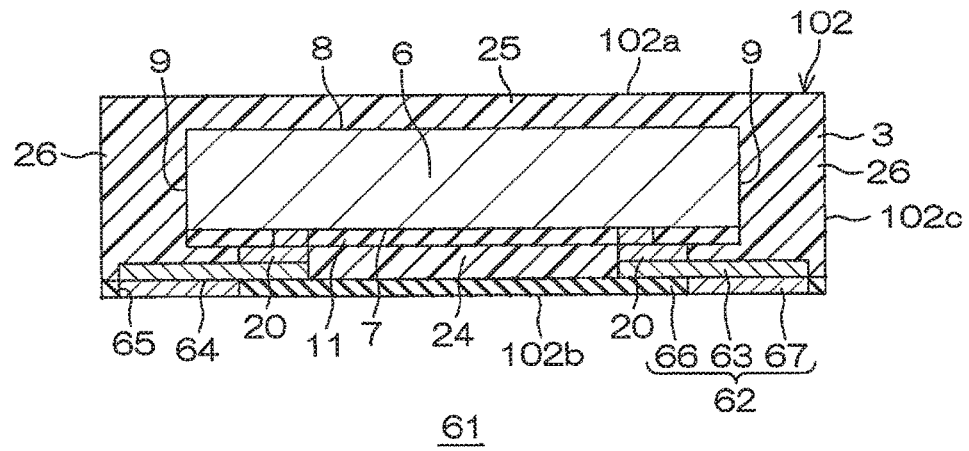
FIG. 26 is a cross-sectional view showing a semiconductor device in accordance with the third embodiment of the present invention.

FIG. 26 is a cross-sectional view showing a semiconductor device 61 according to the third embodiment of the present invention. In FIG. 26, the elements similar to the corresponding elements in FIGS. 1 to 25 have similar reference numerals, and the associated descriptions are omitted.

The semiconductor device 61 includes a rewiring structure 62. A portion of the rewiring structure 62 is coated by the sealing resin 3. More specifically, the rewiring structure 62 includes a rewiring 63 having a portion coated by the sealing resin 3; a back side insulation film 66 having a pad opening 65 for exposing a portion of the rewiring 63 as an electrode pad 64; and an external terminal 67 for electrically connected to the rewiring 63.

The rewiring 63 is sealed through the sealing resin 3 to be exposed from the back side 24 of the sealing resin 3. The rewiring 63 is formed to cross the lateral side 9 of the semiconductor chip 6 and reach the periphery portion 26 of the sealing resin 3. The rewiring 63 includes an end, in the top view, disposed in an area surrounded by the lateral sides 9 of the semiconductor chip 6 and electrically connected to an electrode 20; and the other end, in the top view, disposed outside the area surrounded by the lateral sides 9 of the semiconductor chip 6. The portion of the rewiring 63 exposed from the sealing resin 3 is coplanar with the surface of the back portion 24 of the sealing resin 3. The back side insulation film 66 is formed on the sealing resin 3 so as to cover the rewiring 63.

The external terminal 67 is buried in the pad opening 65 of the back side insulation film 66. The external terminal 67 faces the periphery portion 26 of the sealing resin 3 with the rewiring 63 the glass base 2 interposed therebetween. The external terminal 67 is electrically connected to the semiconductor chip 6 via the rewiring 63 and the electrode 20.

Figure 27:
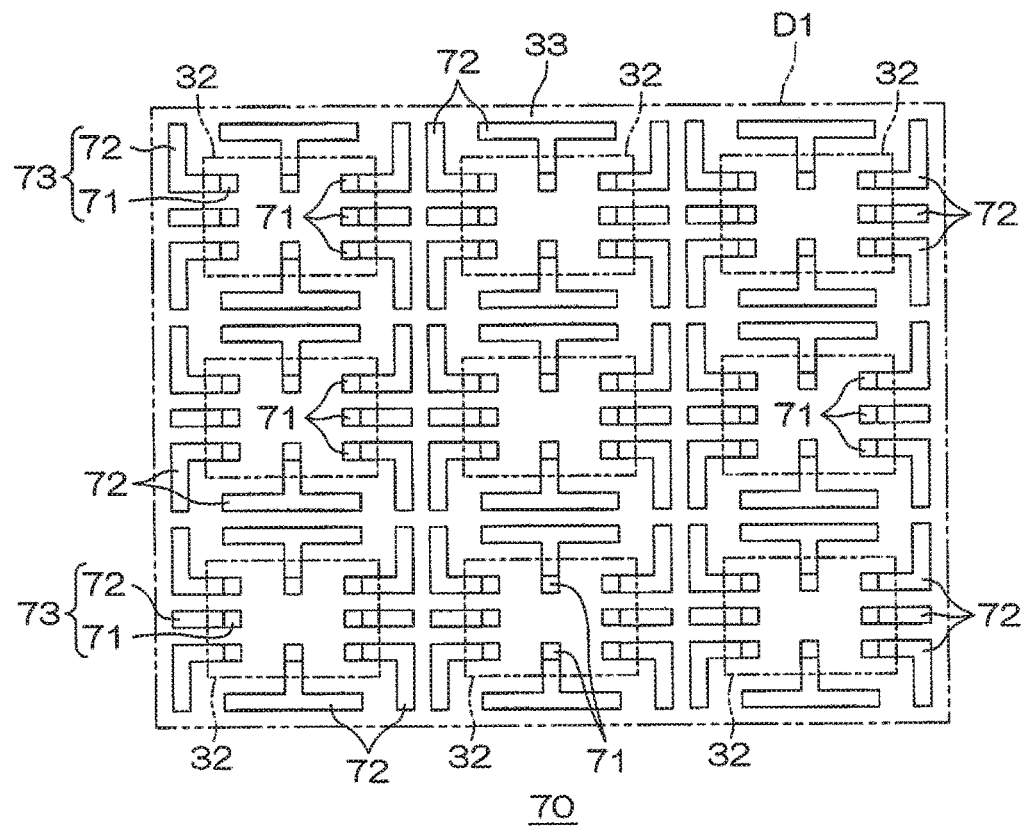
FIG. 27 is a top view showing the support member used in the method for manufacturing the semiconductor device shown in FIG. 26, and is an enlarged top view corresponding to FIG. 7.
Figure 28:
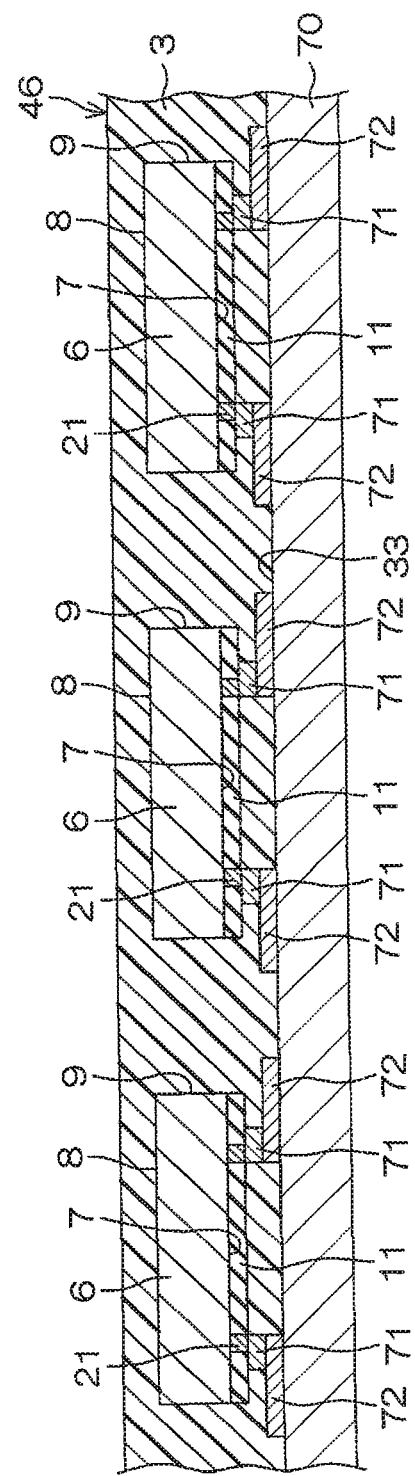
FIG. 28 is a cross-sectional view showing an exemplary method for manufacturing the semiconductor device shown in FIG. 26.
Figure 29:
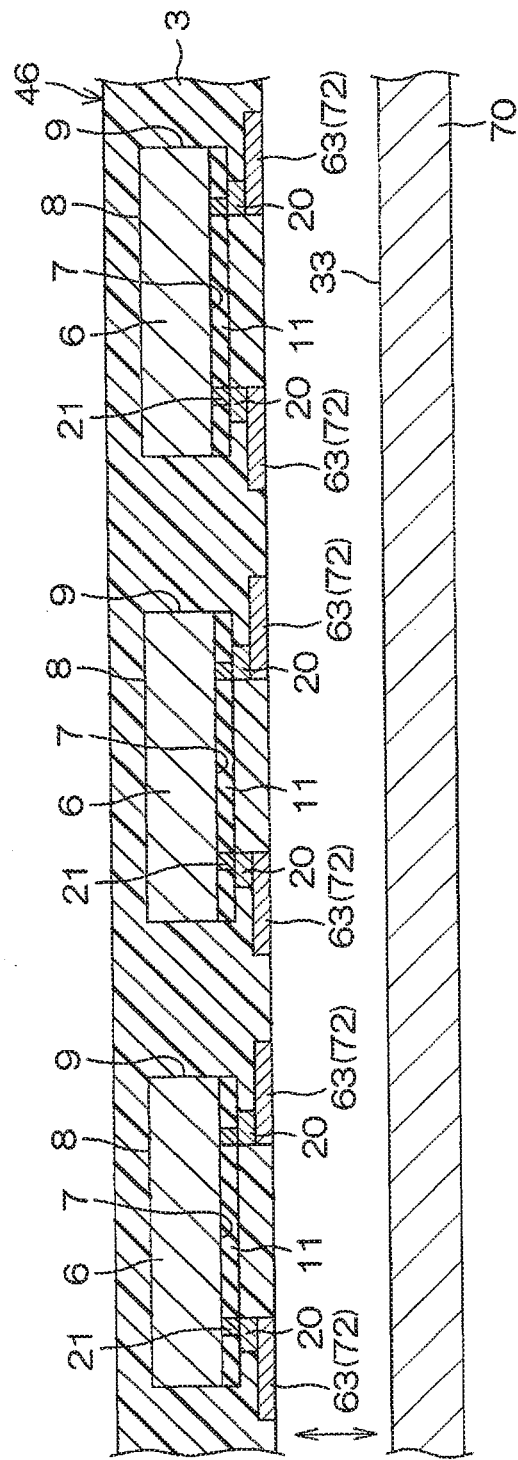
FIG. 29 is a cross-sectional view showing an exemplary method for manufacturing the semiconductor device shown in FIG. 26.
Figure 30:
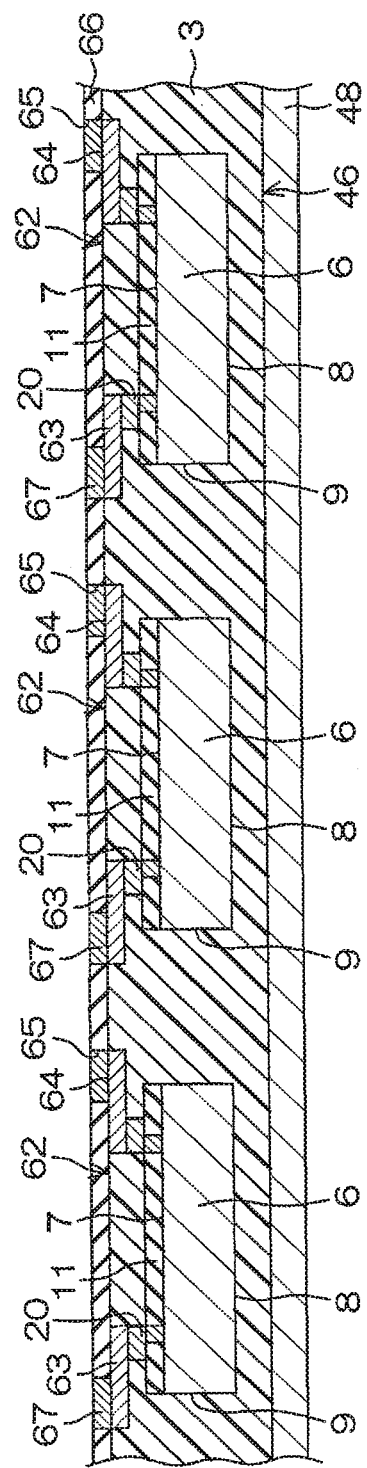
FIG. 30 is a cross-sectional view showing an exemplary method for manufacturing the semiconductor device shown in FIG. 26.

FIG. 27 is a top view showing a support member 70 used in the method for manufacturing the semiconductor device 61 shown in FIG. 26, and is an enlarged view corresponding to FIG. 7. FIGS. 28 to 30 are cross-sectional views showing an example of a method for manufacturing the semiconductor device shown in FIG. 26. If necessary, refer to FIGS. 4 and 17 to 19.

As shown in FIG. 27, when the semiconductor device 61 is manufactured, the support member 70 is prepared instead of the support member 30.

Then, a conductor pattern 73 is formed on each chip arrangement area 32. The conductor pattern 73 includes a plurality of connecting portions 71, and a wiring portion 72 being routed to an area outside the chip arrangement area 32 from each connecting portion 71. More specifically, first, a copper film for form the wiring portion 72 is formed on the support member 70, for example, by sputtering. Then, the copper film is patterned by photolithography and etching. Accordingly, the wiring portion 72 with the desired pattern is formed. Then, the connecting portion 71 connected to the first electrode layer 21 of the semiconductor chip 6 is formed in the chip area 43. As a result, the conductor pattern 73 is formed on the pattern-forming surface 33 of the support member 70. The connecting portion 71 corresponds to the conductor 31 according to the first embodiment, and in the chip arrangement area 32, the connecting portion 71 is connected to the first electrode layer 21 of the semiconductor chip 6 via the solder 23.

Subsequently, as shown in FIG. 28, by performing steps S8 to S9 (referring to FIGS. 4 and 17 to 18), the semiconductor chip 6 is fixed on the support member 70, and the semiconductor chip 6 is coated through the sealing resin 3. Each semiconductor chip 6 is sealed so that the gap between the support member 70 and each semiconductor chip 6 is filled with the sealing resin 3, and the lateral side 9 and the back side 8 of each semiconductor chip 6 are coated with the sealing resin 3. Then, the sealing resin 3 is hardened. Accordingly, the conductor pattern 73 and the semiconductor chip 6 are coated together by the sealing resin 3, such that the sealing structure 46, having the plurality of semiconductor chips 6 sealed through the sealing resin 3, to form a sealing structure 46.

Then, as shown in FIG. 29, by performing a method similar to step S10 (referring to FIGS. 4 and 19), the support member 70 is removed from the sealing structure 46. The conductor pattern 73 formed on the support member 70 is transferred to the sealing structure 46. The wiring portion 72 of the conductor pattern 73 transferred to the sealing structure 46 is exposed from the sealing structure 46. Accordingly, the connecting portion 71 is formed as a second electrode layer 22, and the wiring portion 72 is formed as the rewiring 63.

Then, as shown in FIG. 30, the front side of the sealing structure 46 is fixed on the flexible tape 48. Subsequently, a nitride film is laminated on the back side of the sealing structure 46 to form the back side insulation film 66, for example, by CVD. Then, a resist mask (not shown) is formed on the back side insulation film 66, and the resist mask selectively has an opening in an area where an electrode pad 64 is to be formed. By etching via the resist mask, the pad opening 65 for exposing a portion of the wiring 63 is formed in the back side insulation film 66. After the pad opening 65 is formed, the resist mask is removed.

Then, a nickel film and a gold film are formed sequentially in the pad opening 65 by, for example, electroless plating or electroplating so as to form the external terminal 67. Accordingly, the rewiring structure 62 including a plurality of rewirings 63 corresponding to the plurality of electrodes 20 is formed.

According to the above method, the conductor pattern 73 is pre-formed on a support member 70, and the conductor pattern 73 includes the connecting portion 71 connected to the first electrode layer 21 of the semiconductor chip 6 via the solder 23; and the wiring portion 72 as a source of a rewiring 63. In step S10 of transferring (removing the support member 70), the connecting portion 71 and the wiring portion 72 are transferred integrally to the sealing structure 46. The transferred wiring 72 is formed as the rewiring 63 exposed from the sealing structure 46. According to this method, the rewiring 63 can also be formed on the sealing structure 46, such that the flexibly in design to the arrangement of the external terminal 67 can be improved.

More specifically, the rewiring 63 crossing the lateral side 9 of the semiconductor chip 6 in the top view is formed, such that an area outside the semiconductor chip 6 can be used as an area for forming the external terminal 67. Hence, the area where the external terminal 67 formed to be electrically connected to the rewiring 63 is not limited to the area directly above the element-forming surface 7 of the semiconductor chip 6. Accordingly, a Fan-out semiconductor device 61 with the external terminal 67 formed in an area outside the semiconductor chip 6 can be manufactured. Therefore, a minimized semiconductor device 61 with multiple external terminals 67 can be manufactured.

The above descriptions illustrate a plurality of embodiments of the present invention; however, the present invention can be practiced in other embodiments.

Figure 31:
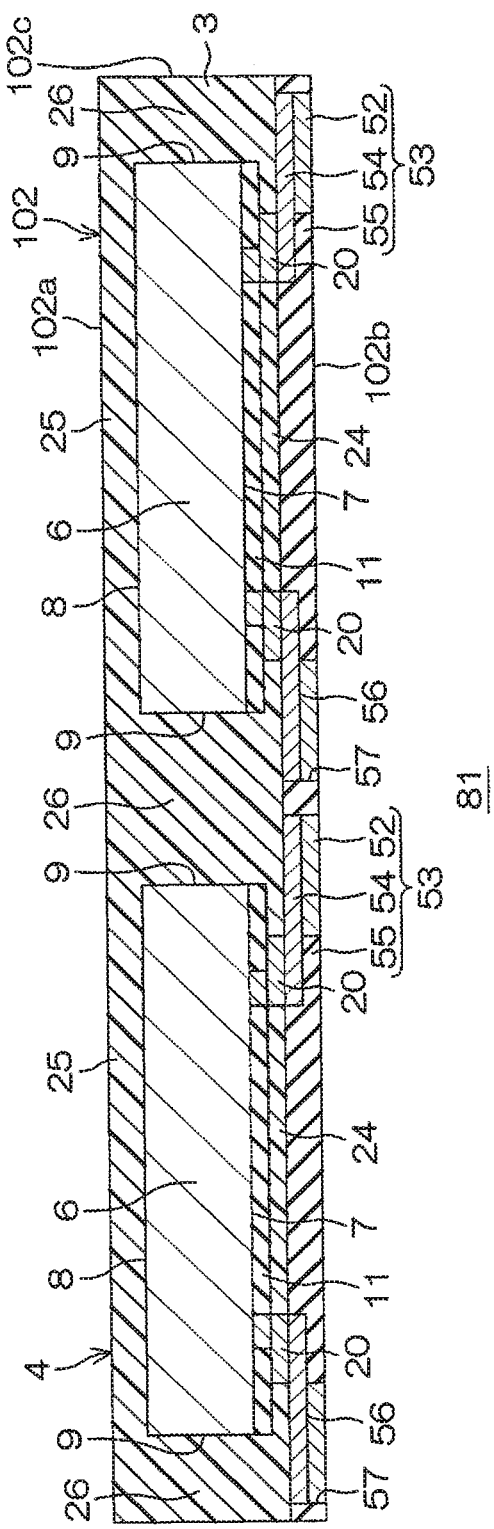
FIG. 31 is a cross-sectional view showing a semiconductor device in accordance with a variation.

For example, in the above embodiments, the semiconductor devices 1, 51, 61 with one semiconductor chip sealed in the sealing resin 3 are illustrated; however, as shown in FIG. 31, a semiconductor device 81 with multiple (at least two) semiconductor chips 6 sealed in the sealing resin 3 can be formed. In FIG. 31, the semiconductor device 81 shows a variation of the semiconductor device 51 according to the second embodiment. The same configuration can be used in the semiconductor device 1 according to the first embodiment and the semiconductor device 61 according to the third embodiment.

Figure 32:
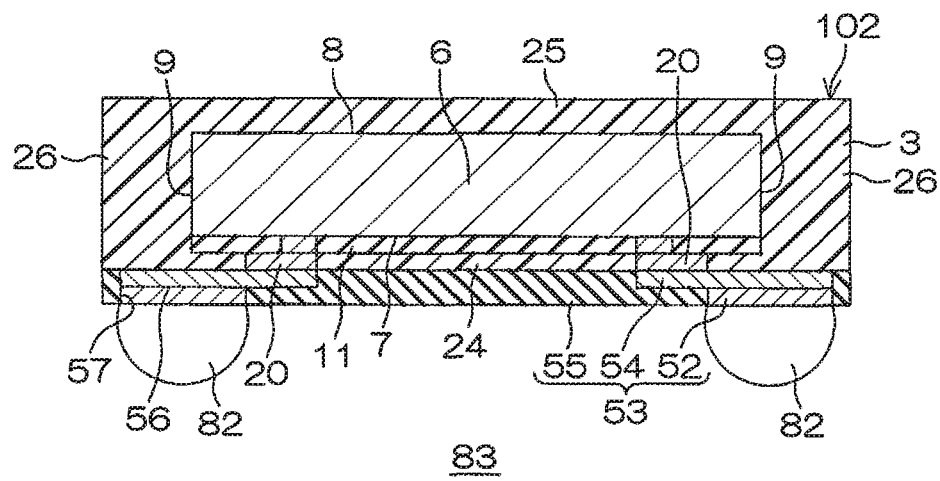
FIG. 32 is a cross-sectional view showing a semiconductor device in accordance with another variation.

Further, in the above embodiments, the semiconductor devices 1, 51, 61 respectively including external terminals 5, 52, 67 exposed from the back side of the package body 2 (the back portion 24 of the sealing resin 3) are illustrated; however, as shown in FIG. 32, a semiconductor device 83 with solder balls 82 connected to the external terminals 5, 52, 67 can be formed. In this configuration, the solder ball 82 is used as an external terminal. According to this configuration, a configuration which has the solder ball 82 directly connected to the electrode 20 without the rewiring structure 53 can also be used.

Figure 33:
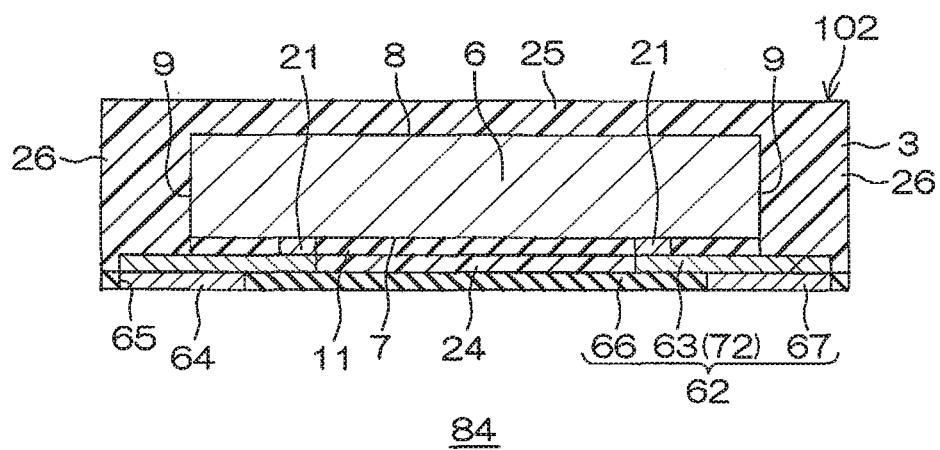
FIG. 33 is a cross-sectional view showing a semiconductor device in accordance with further another variation.

Further, in the third embodiment, the conductor pattern 73 including the connecting portion 71 and the wiring portion 72 is illustrated; however, the connecting portion 71 can be removed from the conductor pattern 73. In this case, the conductor pattern 73 includes the wiring portion 72, wherein a part of the wiring portion 72 is located in the chip arrangement area 32 and serves as a connecting portion connected to the first electrode layer 21 of the semiconductor chip 6. The semiconductor device 84 shown in FIG. 33 is formed while this conductor pattern 73 is used.

Further, in the above embodiments, it is illustrated that the solder 23 is plated to form a film coated on the first electrode layer 21 of the semiconductor chip 6 (referring to step S6 shown in FIG. 6); however, the solder 23 can also be plated to form a film on the conductor 31 (conductor pattern 73) of the support member 30 (support member 70). Further, the solder 23 can be plated to form a film both on the first electrode layer 21 of the semiconductor chip 6, and on the conductor 31 (conductor pattern 73) of the support member 30 (support member 70). Moreover, the solder 23 can be replaced by conductive adhesives (23), such as silver paste. Under this situation, in the above embodiments, the electrode 20 includes a laminated structure having a first electrode layer 21, a second electrode layer 22 formed on the first electrode layer 21, and the conductive adhesives (23) disposed between the first electrode layer 21 and the second electrode layer 22.

Further, in step S8 of the above embodiments (referring to FIG. 4), when the back sides 8 of the plurality of singulated semiconductor chips 6 are fixed on the support tape 45, the first electrode layers 21 of the semiconductor chips 6 can be bonded to the conductor 31 of the support member 30 collectively through the solder 23. According to this step, after a serial of steps from preparing the semiconductor wafer 40 to singulation forming the plurality of semiconductor chips 6 (steps S1 to S7, referring to FIG. 4), all of the singulated semiconductor chips 6 can be collectively fixed on the support member 30.

In addition, various designs and variations are embodied within the scope of claims.

What is claimed is:
1. A method for manufacturing a semiconductor device, comprising:
preparing a plurality of semiconductor chips, each of the plurality of semiconductor chips having a front side;
forming an insulation film covering each front side;
forming a plurality of electrode layers in the insulation film, each of the plurality of electrode layers electrically connected to a semiconductor chip of the plurality of semiconductor chips;

preparing a support member with a plurality of conductors formed on a front side of the support member;

fixing the plurality of semiconductor chips to the support member by bonding each of the plurality of electrode layers to at least one of the plurality of conductors of the support member through a solder;

forming a sealing structure, in which the plurality of semiconductor chips are sealed with a resin while the plurality of semiconductor chips are fixed on the support member;

transferring the plurality of conductors of the support member to the sealing structure by removing the support member from the sealing structure; and singulating the sealing structure into a plurality of sealing structure bodies, wherein the plurality of conductors are configured as external terminals of the plurality of sealing structure bodies.

2. The method according to claim 1, wherein forming the sealing structure comprises coating the plurality of semiconductor chips collectively through the resin.

3. The method according to claim 1, wherein singulating the sealing structure into the plurality of sealing structure bodies includes cutting the sealing structure along a cutting line between the plurality of semiconductor chips, wherein the plurality of sealing structure bodies comprise the plurality of semiconductor chips sealed through the resin.

4. The method according to claim 1, wherein transferring the plurality of conductors comprises forming each of the plurality of conductors as an external terminal in an area surrounded by lateral sides of each of the plurality of semiconductor chips in a top view from a normal direction of the front side of a semiconductor chip of the plurality of semiconductor chips.

5. The method according to claim 1, further comprising forming a rewiring bonded to each of the plurality of the conductors, the rewiring being routed on the sealing structure.

6. The method according to claim 5, wherein forming the rewiring further comprises forming the rewiring to cross a lateral side of one of the plurality of semiconductor chips and drawing the rewiring out to an area outside the one of the plurality of semiconductor chips in a top view from a normal direction of the front side of the one of the plurality of semiconductor chips, the method further comprising: after forming the rewiring, forming an external terminal which is electrically connected to the rewiring and having at least a portion located in an area outside the one of the plurality of semiconductor chips in the top view.

7. The method according to claim 1, wherein each of the plurality of conductors comprises a connecting portion for bonding to an electrode layer of the plurality of electrode layers through the solder, and a wiring portion for bonding to the connecting portion and being routed from the connecting portion; and transferring the plurality of conductors comprises transferring the wiring portion of each of the plurality of conductors to the sealing structure as a rewiring.

8. The method according to claim 7, wherein in transferring the plurality of conductors, in a top view from a normal direction of the front side of one of the plurality of semiconductor chips, the wiring portion is transferred to cross a lateral side of the one of the plurality of semiconductor chips and the rewiring is drawn out to an area outside the one of the plurality of semiconductor chips, and the method further comprising: after transferring the plurality of conductors, forming an external terminal electrically connected to the rewiring, wherein the external terminal has at least a portion located in an area outside the one of the plurality of semiconductor chips in the top view.

9. The method according to claim 1, wherein the support member is a plate member for forming the plurality of conductors, and removing the support member from the sealing structure comprises peeling the plate member from the sealing structure.

10. The method according to claim 9, wherein the plate member is a metal plate comprises stainless steel or copper.

11. The method according to claim 1, wherein the support member is a plate member for forming the plurality of conductors, and removing the support member from the sealing structure comprises removing the plate member by etching.

12. The method according to claim 11, wherein the plate member is a semiconductor plate.

\* \* \* \* \*